(12) United States Patent
Shimizu et al.

(10) Patent No.: US 11,764,270 B2
(45) Date of Patent: Sep. 19, 2023

(54) SEMICONDUCTOR DEVICE, METHOD FOR MANUFACTURING SEMICONDUCTOR DEVICE, INVERTER CIRCUIT, DRIVE DEVICE, VEHICLE, AND ELEVATOR

(71) Applicant: KABUSHIKI KAISHA TOSHIBA, Minato-ku (JP)

(72) Inventors: Tatsuo Shimizu, Shinagawa (JP); Yukio Nakabayashi, Yokohama (JP); Johji Nishio, Machida (JP); Chiharu Ota, Kawasaki (JP); Toshihide Ito, Shibuya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 178 days.

(21) Appl. No.: 16/992,220

(22) Filed: Aug. 13, 2020

(65) Prior Publication Data

US 2021/0296446 A1 Sep. 23, 2021

(30) Foreign Application Priority Data

Mar. 19, 2020 (JP) .................... 2020-049316

(51) Int. Cl.
*H01L 29/16* (2006.01)
*H01L 29/20* (2006.01)
*H01L 29/51* (2006.01)
*C23C 16/453* (2006.01)

(52) U.S. Cl.
CPC ........ *H01L 29/1608* (2013.01); *C23C 16/453* (2013.01); *H01L 29/2003* (2013.01); *H01L 29/517* (2013.01)

(58) Field of Classification Search
CPC ............ H01L 29/1608; H01L 29/2003; H01L 29/517
USPC .......................................................... 257/77
See application file for complete search history.

(56) References Cited

U.S. PATENT DOCUMENTS

| | | | |
|---|---|---|---|
| 11,329,134 B2* | 5/2022 | Shimizu | H01L 29/66068 |
| 2001/0015170 A1* | 8/2001 | Kitabatake | C30B 33/00 257/E29.081 |
| 2012/0199846 A1 | 8/2012 | Shimizu et al. | |
| 2017/0069487 A1 | 3/2017 | Watanabe et al. | |
| 2019/0279862 A1* | 9/2019 | Park | C09D 183/04 |

(Continued)

FOREIGN PATENT DOCUMENTS

| | | |
|---|---|---|
| JP | 2011-146580 A | 7/2011 |
| JP | 2011-165941 A | 8/2011 |

(Continued)

*Primary Examiner* — Igwe U Anya
(74) *Attorney, Agent, or Firm* — Oblon, McClelland, Maier & Neustadt, L.L.P.

(57) ABSTRACT

A semiconductor device according to an embodiment includes: a silicon carbide layer; a silicon oxide layer; and a region disposed between the silicon carbide layer and the silicon oxide layer and having a nitrogen concentration equal to or more than $1 \times 10^{21}$ cm$^{-3}$. Nitrogen concentration distribution in the silicon carbide layer, the silicon oxide layer, and the region have a peak in the region, a nitrogen concentration at a position 1 nm away from the peak to the side of the silicon oxide layer is equal to or less than $1 \times 10^{18}$ cm$^{-3}$, and a carbon concentration at the position is equal to or less than $1 \times 10^{18}$ cm$^{-3}$.

15 Claims, 17 Drawing Sheets

(56) References Cited

U.S. PATENT DOCUMENTS

2021/0083062 A1    3/2021  Shimizu
2021/0296128 A1*   9/2021  Shimizu ............ H01L 21/02337

FOREIGN PATENT DOCUMENTS

| JP | 2012-164788 A | 8/2012 |
| JP | 2017-55098 A  | 3/2017 |
| JP | 2021-48198 A  | 3/2021 |

* cited by examiner

SEMICONDUCTOR DEVICE, METHOD FOR MANUFACTURING SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2020-049316, filed on Mar. 19, 2020, the entire contents of which are incorporated herein by reference.

FIELD

Embodiments described herein relate generally to a semiconductor device, a method for manufacturing a semiconductor device, an inverter circuit, a drive device, a vehicle, and an elevator.

BACKGROUND

Silicon carbide (SiC) is expected as a material for next-generation semiconductor devices. As compared with silicon (Si), silicon carbide has superior physical properties such as a threefold band gap, approximately tenfold breakdown field strength, and approximately threefold thermal conductivity. By using these characteristics, a semiconductor device in which low loss and high-temperature operation can be implemented can be realized.

However, for example, when a metal oxide semiconductor field effect transistor (MOSFET) is formed using silicon carbide, there is a problem that carrier mobility decreases or a threshold voltage changes. One of factors causing the decrease in the carrier mobility or the change in the threshold voltage is considered to be carbon defects existing in a gate insulating layer.

DETAILED DESCRIPTION

Figure 1:
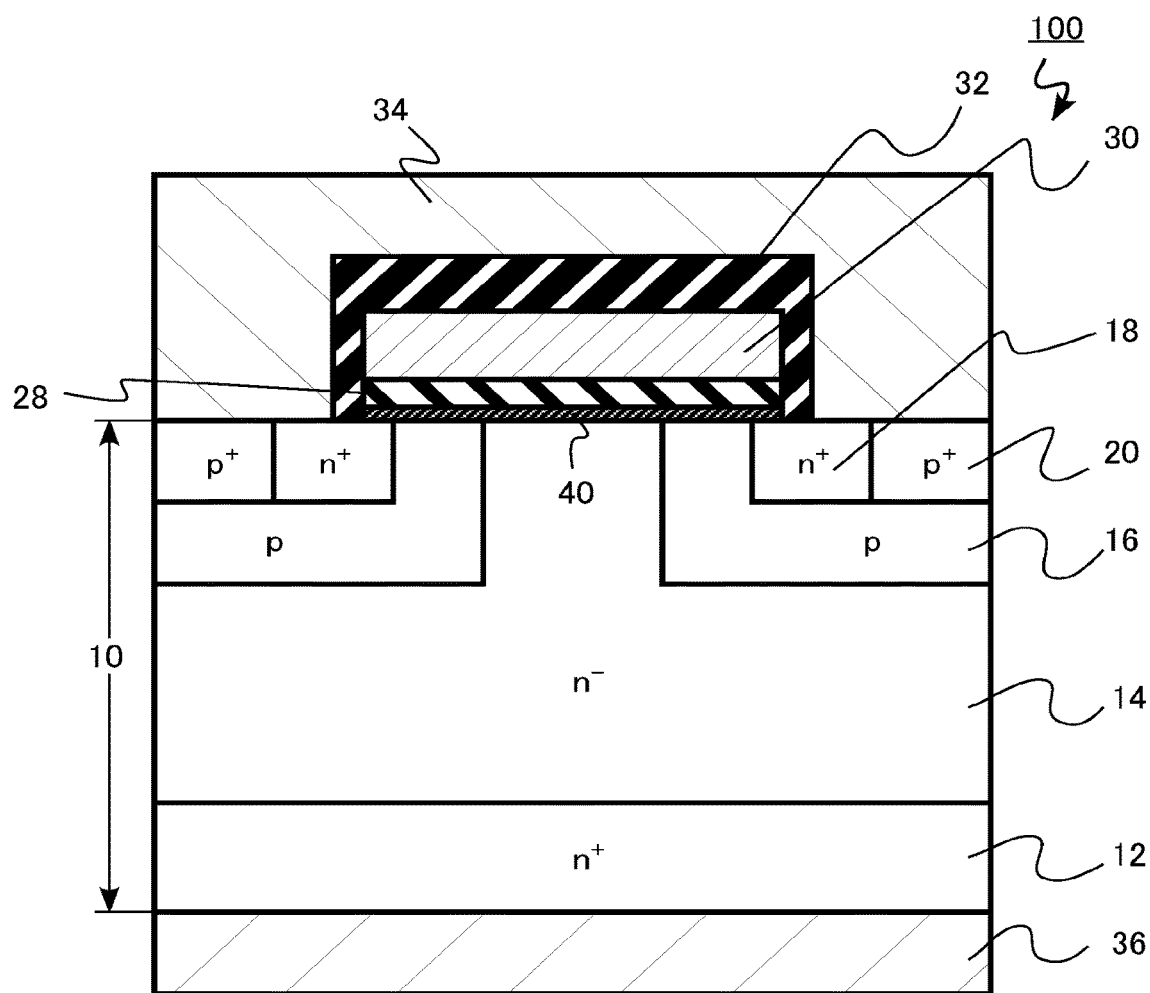
FIG. 1 is a schematic cross-sectional view of a semiconductor device according to a first embodiment.

A semiconductor device according to an embodiment includes: a silicon carbide layer; a silicon oxide layer; and a region disposed between the silicon carbide layer and the silicon oxide layer and having a nitrogen concentration equal to or more than $1 \times 10^{21}$ cm$^{-3}$. Nitrogen concentration distribution in the silicon carbide layer, the silicon oxide layer, and the region have a peak in the region, a nitrogen concentration at a position 1 nm away from the peak to the side of the silicon oxide layer is equal to or less than $1 \times 10^{18}$ cm$^{-3}$, and a carbon concentration at the position is equal to or less than $1 \times 10^{18}$ cm$^{-3}$.

Hereinafter, embodiments of the present disclosure will be described with reference to the drawings. In the following description, the same or similar members are denoted by the same reference numerals and the description of the members described once is appropriately omitted.

In addition, in the following description, notations n$^+$, n, n$^-$, p$^+$, p, and p$^-$ represent the relative magnitudes of impurity concentrations in respective conductive types. That is, an n-type impurity concentration of n$^+$ is relatively higher than an n-type impurity concentration of n and an n-type impurity concentration of n$^-$ is relatively lower than the n-type impurity concentration of n. In addition, a p-type impurity concentration of p$^+$ is relatively higher than a p-type impurity concentration of p and a p-type impurity concentration of p$^-$ is relatively lower than the p-type impurity concentration of p. The n$^+$ type and the n$^-$ type may be simply described as the n types and the p$^+$ type and the p$^-$ type may be simply described as the p types. An impurity concentration of each region is represented by, for example, a value of an impurity concentration of a center portion of each region, unless otherwise specified.

The impurity concentration can be measured by secondary ion mass spectrometry (SIMS), for example. In addition, the relative magnitude of the impurity concentration can be determined from the magnitude of a carrier concentration obtained by scanning capacitance microscopy (SCM), for example. In addition, a distance such as a width and a depth of an impurity region can be obtained by SIMS, for example. In addition, the distance such as the width and the depth of the impurity region can be obtained from an SCM image, for example.

A depth of a trench, a thickness of an insulating layer, and the like can be measured on an SIMS or transmission electron microscope (TEM) image, for example.

Bonding states of carbon atoms, nitrogen atoms, and oxygen atoms in a silicon carbide layer can be identified by using X-ray photoelectron spectroscopy (XPS method).

First Embodiment

A semiconductor device according to a first embodiment includes: a silicon carbide layer; a silicon oxide layer; and a region disposed between the silicon carbide layer and the silicon oxide layer and having a nitrogen concentration equal to or more than $1\times10^{21}$ cm$^{-3}$. Nitrogen concentration distribution in the silicon carbide layer, the silicon oxide layer, and the region have a peak in the region, a nitrogen concentration at a position 1 nm away from the peak to the side of the silicon oxide layer is equal to or less than $1\times10^{18}$ cm$^{-3}$, and a carbon concentration at the position is equal to or less than $1\times10^{18}$ cm$^{-3}$.

FIG. 1 is a schematic cross-sectional view of the semiconductor device according to the first embodiment. The semiconductor device is a MOSFET 100. The MOSFET 100 is a double implantation MOSFET (DIMOSFET) in which a p-well and a source region are formed by ion implantation. Further, the MOSFET 100 is an n-channel MOSFET using electrons as carriers.

The MOSFET 100 includes a silicon carbide layer 10, a gate insulating layer 28 (silicon oxide layer), a gate electrode 30, an interlayer insulating film 32, a source electrode 34, a drain electrode 36, and an interface termination region 40 (region).

The silicon carbide layer 10 includes a drain region 12, a drift region 14, a p-well region 16, a source region 18, and a p-well contact region 20.

The silicon carbide layer 10 is, for example, single crystal of 4H-SiC. The silicon carbide layer 10 is disposed between the source electrode 34 and the drain electrode 36.

Figure 2:
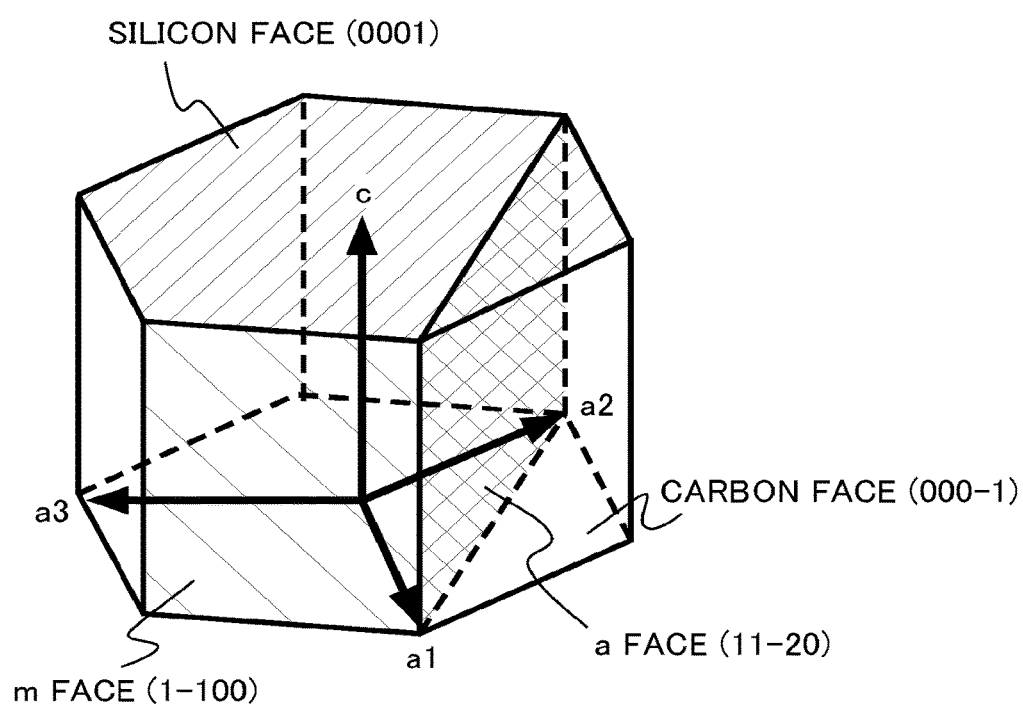
FIG. 2 is a diagram showing a crystal structure of a SiC semiconductor.

FIG. 2 is a diagram showing a crystal structure of a SiC semiconductor. A typical crystal structure of the SiC semiconductor is a hexagonal crystal system such as 4H-SiC. One of faces (top faces of a hexagonal column) with a c-axis along an axial direction of the hexagonal column as a normal is a (0001) face. A face equivalent to the (0001) face is referred to as a silicon face (Si face) and expressed as a (0001) face. Silicon atoms (Si) are arranged on an outermost face of the silicon face.

The other of the faces (top faces of the hexagonal column) with the c-axis along the axial direction of the hexagonal column as the normal is a (000-1) face. A face equivalent to the (000-1) face is referred to as a carbon face (C face) and expressed as a {000-1} face. Carbon atoms (C) are arranged on an outermost face of the carbon face.

On the other hand, a side face (column face) of the hexagonal column is an m face to be a face equivalent to a (1-100) face, that is, a {1-100} face. Further, a face passing through a pair of ridge lines not adjacent to each other is an a face to be a face equivalent to a (11-20) face, that is, a {11-20} face. Both the silicon atoms (Si) and the carbon atoms (C) are arranged on outermost faces of the m face and the a face.

Hereinafter, a case where a face of the silicon carbide layer 10 is a face inclined by an angle equal to or more than 0 degrees and equal to or less than 8 degrees with respect to the silicon face and a back face is a face inclined by an angle equal to or more than 0 degrees and equal to or less than 8 degrees with respect to the carbon face will be described as an example. The face of the silicon carbide layer 10 has an off angle equal to or more than 0 degrees and equal to or less than 8 degrees with respect to the silicon face.

The drain region 12 is n$^+$-type SiC. The drain region 12 includes nitrogen (N) as n-type impurities, for example. An n-type impurity concentration of the drain region 12 is, for example, equal to or more than $1\times10^{18}$ cm$^{-3}$ and equal to or less than $1\times10^{21}$ cm$^{-3}$.

The drift region 14 is provided on the drain region 12. The drift region 14 is n$^-$-type SiC. The drift region 14 includes nitrogen as n-type impurities, for example.

An n-type impurity concentration of the drift region 14 is lower than the n-type impurity concentration of the drain region 12. The n-type impurity concentration of the drift region 14 is, for example, equal to or more than $1\times10^{15}$ cm$^{-3}$ and equal to or less than $2\times10^{16}$ cm$^{-3}$. The drift region 14 is, for example, an SiC epitaxial growth layer formed on the drain region 12 by epitaxial growth.

A thickness of the drift region 14 is, for example, equal to or more than 5 μm and equal to or less than 100 μm.

The p-well region 16 is provided on a partial face of the drift region 14. The p-well region 16 is p-type SiC. The p-well region 16 includes aluminum (Al) as p-type impurities, for example. A p-type impurity concentration of the p-well region 16 is, for example, equal to or more than $1\times10^{16}$ cm$^{-3}$ and equal to or less than $1\times10^{20}$ cm$^{-3}$.

A depth of the p-well region 16 is, for example, equal to or more than 0.4 μm and equal to or less than 0.8 μm. The p-well region 16 functions as a channel region of the MOSFET 100.

The source region 18 is provided on a partial face of the p-well region 16. The source region 18 is n$^+$-type SiC. The source region 18 includes phosphorus (P) as n-type impurities, for example. An n-type impurity concentration of the source region 18 is, for example, equal to or more than $1\times10^{18}$ cm$^{-3}$ and equal to or less than $1\times10^{2}$ cm$^{-3}$.

A depth of the source region 18 is shallower than the depth of the p-well region 16. The depth of the source region 18 is, for example, equal to or more than 0.2 μm and equal to or less than 0.4 μm.

The p-well contact region 20 is provided on a partial face of the p-well region 16. The p-well contact region 20 is provided on the side of the source region 18. The p-well contact region 20 is p$^+$-type SiC.

The p-well contact region 20 includes aluminum as p-type impurities, for example. A p-type impurity concentration of the p-well contact region 20 is, for example, equal to or more than $1\times10^{18}$ cm$^{-3}$ and equal to or less than $1\times10^{22}$ cm$^{-3}$.

A depth of the p-well contact region 20 is shallower than the depth of the p-well region 16. The depth of the p-well contact region 20 is, for example, equal to or more than 0.2 μm and equal to or less than 0.4 μm.

The gate insulating layer 28 is provided between the silicon carbide layer 10 and the gate electrode 30. The gate insulating layer 28 is provided between the drift region 14 and the p-well region 16 and the gate electrode 30. The gate insulating layer 28 is provided on the drift region 14 and the p-well region 16. The gate insulating layer 28 is continuously formed on the faces of the drift region 14 and the p-well region 16.

The gate insulating layer 28 is, for example, silicon oxide. The gate insulating layer 28 is an example of a silicon oxide layer.

A thickness of the gate insulating layer 28 is, for example, equal to or more than 30 nm and equal to or less than 100 nm. The gate insulating layer 28 functions as a gate insulating layer of the MOSFET 100. The thickness of the gate insulating layer 28 is, for example, equal to or more than 40 nm and equal to or less than 50 nm.

The interface termination region 40 is disposed between the silicon carbide layer 10 and the gate insulating layer 28. The interface termination region 40 is disposed between the drift region 14 and the gate insulating layer 28, and the p-well region 16 and the gate insulating layer 28. The interface termination region 40 includes nitrogen (N) as a termination element terminating a dangling bond of the silicon carbide layer 10. The interface termination region 40 is an example of a region.

A nitrogen concentration of the interface termination region 40 is equal to or more than $1 \times 10^{21}$ cm$^{-3}$.

Figure 3:
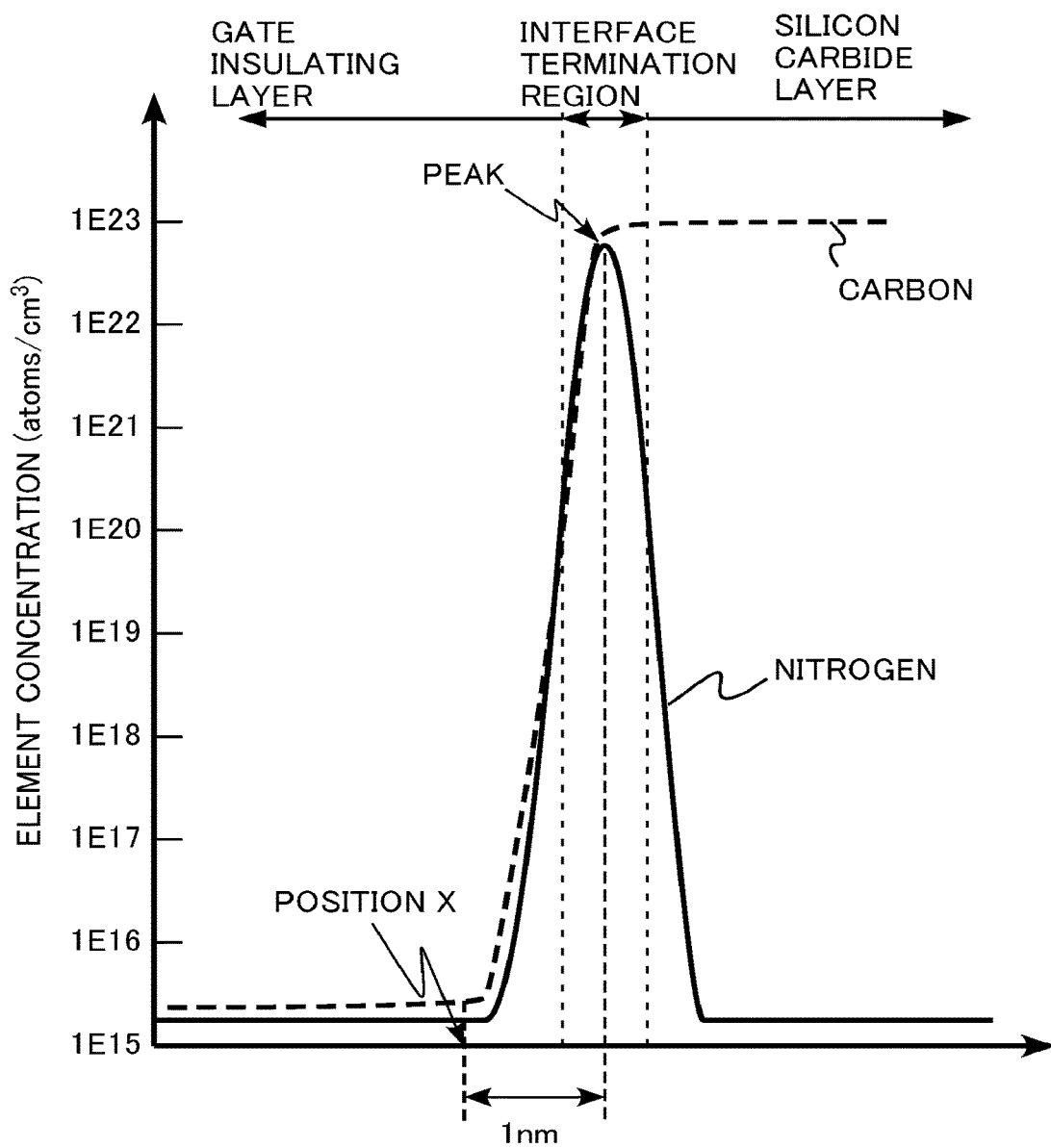
FIG. 3 is a diagram showing an element concentration distribution of the semiconductor device according to the first embodiment.

FIG. 3 is a diagram showing an element concentration distribution of the semiconductor device according to the first embodiment. FIG. 3 is a diagram showing element concentration distributions in the gate insulating layer 28, the interface termination region 40, and the silicon carbide layer 10. FIG. 3 shows concentration distributions of nitrogen and carbon.

The nitrogen concentration distribution has a peak in the interface termination region 40. A nitrogen concentration at the peak is, for example, equal to or more than $1 \times 10^{22}$ cm$^{-3}$. A full width at half maximum with respect to the peak of the nitrogen concentration distribution is, for example, equal to or less than 1 nm. Nitrogen is segregated at an interface between the silicon carbide layer 10 and the gate insulating layer 28.

The nitrogen concentration at a position X to be 1 nm away from the peak of the nitrogen concentration distribution to the side of the gate insulating layer 28 is equal to or less than $1 \times 10^{19}$ cm$^{-3}$. The nitrogen concentration is preferably equal to or less than $1 \times 10^{17}$ cm$^{-3}$ and more preferably equal to or less than $1 \times 10^{16}$ cm$^{-3}$.

Nitrogen in the interface termination region 40 substitutes outermost carbon atoms of the silicon carbide layer 10. Nitrogen in the interface termination region 40 is tri-coordinated with the silicon carbide layer. In other words, nitrogen atoms are at positions of carbon atoms in a crystal structure of silicon carbide.

Nitrogen substitutes carbon atoms of a bilayer configuring an uppermost layer of the silicon carbide layer 10. Excess silicon atoms or carbon atoms are emitted to the side of an insulating film, and the termination element is finally bonded to the silicon carbide layer 10 in a tri-coordination manner. A nitrogen atom is at the position of the carbon atom in the crystal structure of silicon carbide. A part of the outermost silicon is absorbed into the side of the gate insulating layer 28. A nitrogen atom is tri-coordinated with the silicon atoms of the silicon carbide layer 10.

A nitrogen concentration at the peak of the nitrogen concentration distribution is, for example, equal to or more than $1 \times 10^{21}$ cm$^{-3}$ and equal to or less than $4 \times 10^{23}$ cm$^{-3}$. In order to ensure the termination, the peak nitrogen concentration is preferably equal to or more than $1 \times 10^{22}$ cm$^{-1}$. On the other hand, if there is excess nitrogen, this causes charge trapping, so that the peak nitrogen concentration is preferably equal to or less than $1 \times 10^{23}$ cm$^{-3}$. Typically, the peak nitrogen concentration is about $5.0 \times 10^{22}$ cm$^{-3}$, that is, $5.0 \times 10^{22}$ cm$^{-3} \pm 5\%$. When the nitrogen concentration at the peak is in the above range, good characteristics in which there is no charge trapping are exhibited, for example.

A nitrogen area density at the interface is preferably equal to or more than $1 \times 10^{14}$ cm$^{-2}$ and equal to or less than $2.5 \times 10^{15}$ cm$^{-2}$. Typically, the nitrogen area density is about $1.4 \times 10^{15}$ cm$^{-2}$, that is, $1.4 \times 10^{15}$ cm$^{-2} \pm 5\%$. When the nitrogen area density is in the above range, good characteristics in which there is no charge trapping are exhibited, for example.

The carbon concentration distribution decreases from the interface termination region 40 toward the gate insulating layer 28. The carbon concentration at the position X is equal to or less than $1 \times 10^{18}$ cm$^{-3}$. The nitrogen concentration is preferably equal to or less than $1 \times 10^{17}$ cm$^{-3}$ and more preferably equal to or less than $1 \times 10^{16}$ cm$^{-3}$.

A concentration at the position X of a complex including the carbon atoms bonded to the oxygen atoms and the nitrogen atoms bonded to the oxygen atoms is, for example, equal to or less than $1 \times 10^{18}$ cm$^{-3}$. The nitrogen concentration is preferably equal to or less than $1 \times 10^{17}$ cm$^{-3}$ and more preferably equal to or less than $1 \times 10^{16}$ cm$^{-3}$.

The gate electrode 30 is provided on the gate insulating layer 28. The gate electrode 30 sandwiches the gate insulating layer 28 with the silicon carbide layer 10. The gate electrode 30 sandwiches the gate insulating layer 28 with the drift region 14. The gate electrode 30 sandwiches the gate insulating layer 28 with the p-well region 16.

The gate electrode 30 is, for example, polycrystalline silicon including n-type impurities or p-type impurities.

The interlayer insulating film 32 is formed on the gate electrode 30. The interlayer insulating film 32 is, for example, a silicon oxide film.

The source electrode 34 is electrically connected to the source region 18 and the p-well contact region 20. The source electrode 34 also functions as a p-well electrode for applying an electric potential to the p-well region 16.

The source electrode 34 is formed of, for example, a stacked layer of a barrier metal layer of nickel (Ni) and a metal layer of aluminum on the barrier metal layer. The barrier metal layer of nickel and the silicon carbide layer may react to form nickel silicide (NiSi, Ni$_2$Si, or the like). The barrier metal layer of nickel and the metal layer of aluminum may form an alloy by reaction.

The drain electrode 36 is provided on the side of the silicon carbide layer 10 opposite to the source electrode 34, that is, the back side. The drain electrode 36 is, for example, nickel. Nickel may react with the drain region 12 to form nickel silicide (NiSi, Ni$_2$Si, or the like).

In the first embodiment, the n-type impurity is, for example, nitrogen or phosphorus. Arsenic (As) or antimony (Sb) can also be applied as the n-type impurity.

Further, in the first embodiment, the p-type impurity is, for example, aluminum. Boron (B), gallium (Ga), and indium (In) can also be applied as the p-type impurity.

Next, an example of a method for manufacturing the semiconductor device according to the first embodiment will be described.

The method for manufacturing the semiconductor device according to the first embodiment includes forming a silicon oxide film on a face of a silicon carbide layer and performing first heat treatment in an atmosphere including carbon dioxide gas and at least one oxidizing gas selected from the group consisting of nitrogen oxide gas, oxygen gas, and water vapor.

Figure 4:
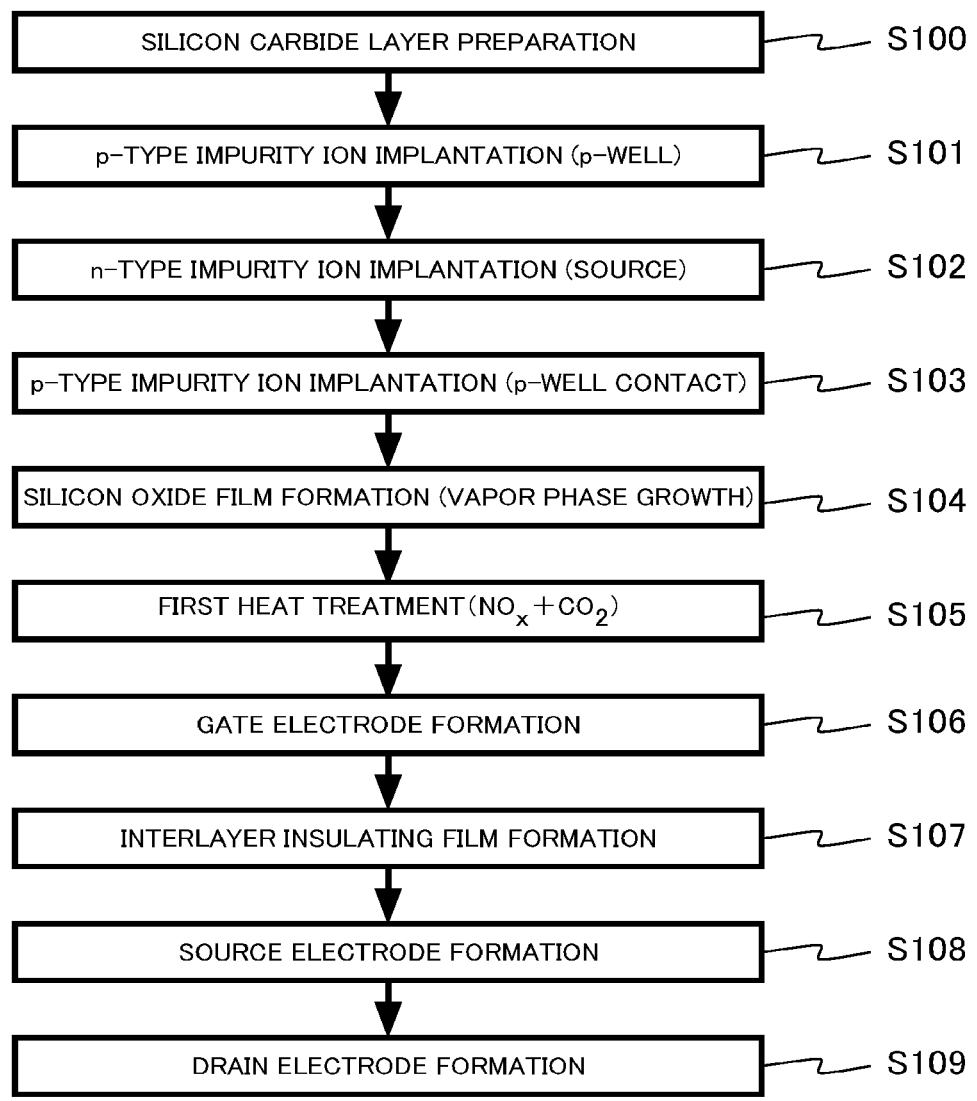
FIG. 4 is a process flow diagram of a method for manufacturing the semiconductor device according to the first embodiment.

FIG. 4 is a process flow diagram of the method for manufacturing the semiconductor device according to the first embodiment.

As shown in FIG. 4, the method for manufacturing the semiconductor device according to the first embodiment includes silicon carbide layer preparation (step S100), p-type impurity ion implantation (step S101), n-type impurity ion implantation (step S102), p-type impurity ion implantation (step S103), silicon oxide film formation (step S104), first heat treatment (step S105), gate electrode formation (step S106), interlayer insulating film formation (step S107), source electrode formation (step S108), and drain electrode formation (step S109).

In step S100, the silicon carbide layer 10 is prepared. The silicon carbide layer 10 includes the n$^+$-type drain region 12 and the n$^-$-type drift region 14. The drift region 14 is formed on the drain region 12 by an epitaxial growth method, for example.

The drain region 12 includes nitrogen as n-type impurities. An n-type impurity concentration of the drain region 12 is, for example, equal to or more than $1 \times 10^{10}$ cm$^{-3}$ and equal to or less than $1 \times 10^{21}$ cm$^{-3}$.

The drift region 14 includes nitrogen as n-type impurities. The n-type impurity concentration of the drift region 14 is, for example, equal to or more than $1 \times 10^{15}$ cm$^{-3}$ and equal to or less than $2 \times 10^{16}$ cm$^{-3}$. A thickness of the drift region 14 is, for example, equal to or more than 5 μm and equal to or less than 100 μm.

In step S101, first, a first mask material is formed by patterning using photolithography and etching. Then, by using the first mask material as an ion implantation mask, aluminum to be p-type impurities is ion-implanted into the drift region 14. The p-well region 16 is formed by ion implantation.

In step S102, first, a second mask material is formed by patterning using photolithography and etching. Then, by using the second mask material as an ion implantation mask, phosphorus to be n-type impurities is ion-implanted into the drift region 14 to form the source region 18.

In step S103, a third mask material is formed by patterning using photolithography and etching. By using the third mask material as an ion implantation mask, aluminum to be p-type impurities is ion-implanted into the drift region 14 to form the p-well contact region 20.

In step S104, a silicon oxide film is formed on the silicon carbide layer 10. The silicon oxide film finally becomes the gate insulating layer 28.

The silicon oxide film is formed by vapor phase growth. The silicon oxide film is formed by, for example, a chemical vapor deposition method (CVD method) or a physical vapor deposition method (PVD method). The silicon oxide film is a deposited film. The thickness of the silicon oxide film is, for example, equal to or more than 30 nm and equal to or less than 100 nm. The thickness of the silicon oxide film is, for example, equal to or more than 40 nm and equal to or less than 50 nm.

The silicon oxide film is, for example, a silicon oxide film formed by the CVD method using tetraethyl orthosilicate (TEOS) as source gas.

In step S105, first heat treatment is performed. The first heat treatment is performed in an atmosphere including nitrogen oxide gas (NOx) and carbon dioxide gas ($CO_2$). The nitrogen oxide gas is an example of oxidizing gas. The nitrogen oxide gas is, for example, nitric monoxide gas (NO). Further, the nitrogen oxide gas is, for example, dinitrogen monoxide gas ($N_2O$).

For example, heat treatment is performed by supplying nitrogen oxide gas (NOx) and carbon dioxide gas ($CO_2$) to a reaction furnace containing the silicon carbide layer 10.

A temperature of the first heat treatment is, for example, equal to or more than 1050° C. and equal to or less than 1450° C.

A partial pressure of the carbon dioxide gas in the atmosphere of the first heat treatment is, for example, equal to or more than 10% and equal to or less than 50%.

A partial pressure of the nitrogen oxide gas in the atmosphere of the first heat treatment is, for example, equal to or more than 10% and equal to or less than 50%.

A ratio of the partial pressure of the nitrogen oxide gas to the partial pressure of the carbon dioxide gas in the atmosphere of the first heat treatment is, for example, equal to or more than 0.8 and equal to or less than 1.2.

By the first heat treatment, the interface termination region 40 is formed at the interface between the silicon carbide layer 10 and the silicon oxide film. By the first heat treatment, a silicon oxide film with reduced carbon defects is formed.

The first heat treatment also functions as densification annealing of the silicon oxide film. By the first heat treatment, the silicon oxide film becomes a high-density film.

In step S106, the gate electrode 30 is formed on the gate insulating layer 28. The gate electrode 30 is, for example, polycrystalline silicon including n-type impurities or p-type impurities.

In step S107, the interlayer insulating film 32 is formed on the gate electrode 30. The interlayer insulating film 32 is, for example, a silicon oxide film.

In step S108, the source electrode 34 is formed. The source electrode 34 is formed on the source region 18 and the p-well contact region 20. The source electrode 34 is formed by sputtering of nickel (Ni) and aluminum (Al), for example.

In step S109, the drain electrode 36 is formed. The drain electrode 36 is formed on the back side of the silicon carbide layer 10. The drain electrode 36 is formed by sputtering of nickel, for example.

The MOSFET 100 shown in FIG. 1 is formed by the above manufacturing method.

Next, functions and effects of the semiconductor device and the method for manufacturing the semiconductor device according to the first embodiment will be described.

When the MOSFET is formed using silicon carbide, there is a problem that carrier mobility decreases. One of factors causing the decrease in the carrier mobility is considered to be an interface state between the silicon carbide layer and the gate insulating layer. It is considered that the interface state is caused by the dangling bond existing on the face of the silicon carbide layer.

The MOSFET 100 according to the first embodiment includes the interface termination region 40 in which nitrogen is segregated between the silicon carbide layer 10 and the gate insulating layer 28. By the interface termination region 40, the dangling bond is reduced. Therefore, a MOSFET in which the decrease in the carrier mobility is suppressed is realized.

Further, when the MOSFET is formed using silicon carbide, there is a problem that the carrier mobility decreases or a threshold voltage changes. Further, there is a problem that a leakage current of the gate insulating layer increases or reliability of the gate insulating layer decreases. One of factors causing the above problems is considered to be carbon defects existing in the gate insulating layer.

The carbon defects are considered to be the factor causing the above problems by forming trap levels in the gate insulating layer.

There are various forms in the carbon defects. The carbon defects are, for example, a double bond between carbon atoms, tri-coordination carbon in which three silicon atoms are coordinated, a structure in which oxygen atoms are double-bonded to carbon atoms, and the like. It has been clarified by the first principle calculation by the inventors that these carbon defects form trap levels due to Pz orbitals. These carbon defects are formed by the introduction of carbon atoms into oxygen sites of silicon oxide.

Another form of the carbon defects is, for example, a complex including carbon atoms bonded to oxygen atoms and nitrogen atoms bonded to the oxygen atoms. The complex is a C—O—N bond.

Figure 5:
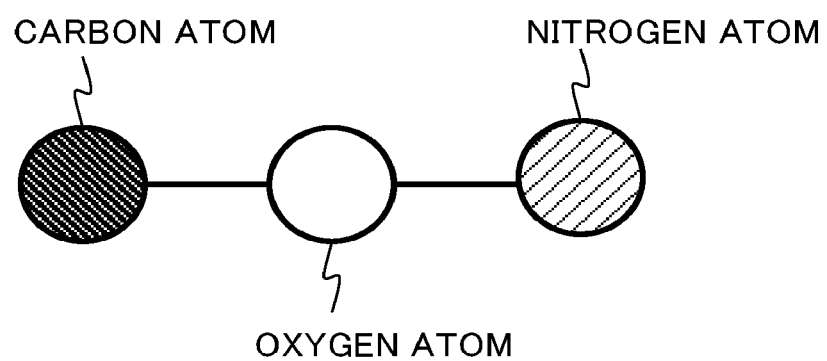
FIG. 5 is a diagram illustrating carbon defects.

FIG. 5 is a diagram illustrating the carbon defects. FIG. 5 shows a complex including a carbon atom bonded to an oxygen atom and a nitrogen atom bonded to the oxygen atom. FIG. 5 shows a C—O—N bond. The carbon atom and the nitrogen atom of the C—O—N bond are introduced into the silicon sites of silicon oxide.

Figure 6:
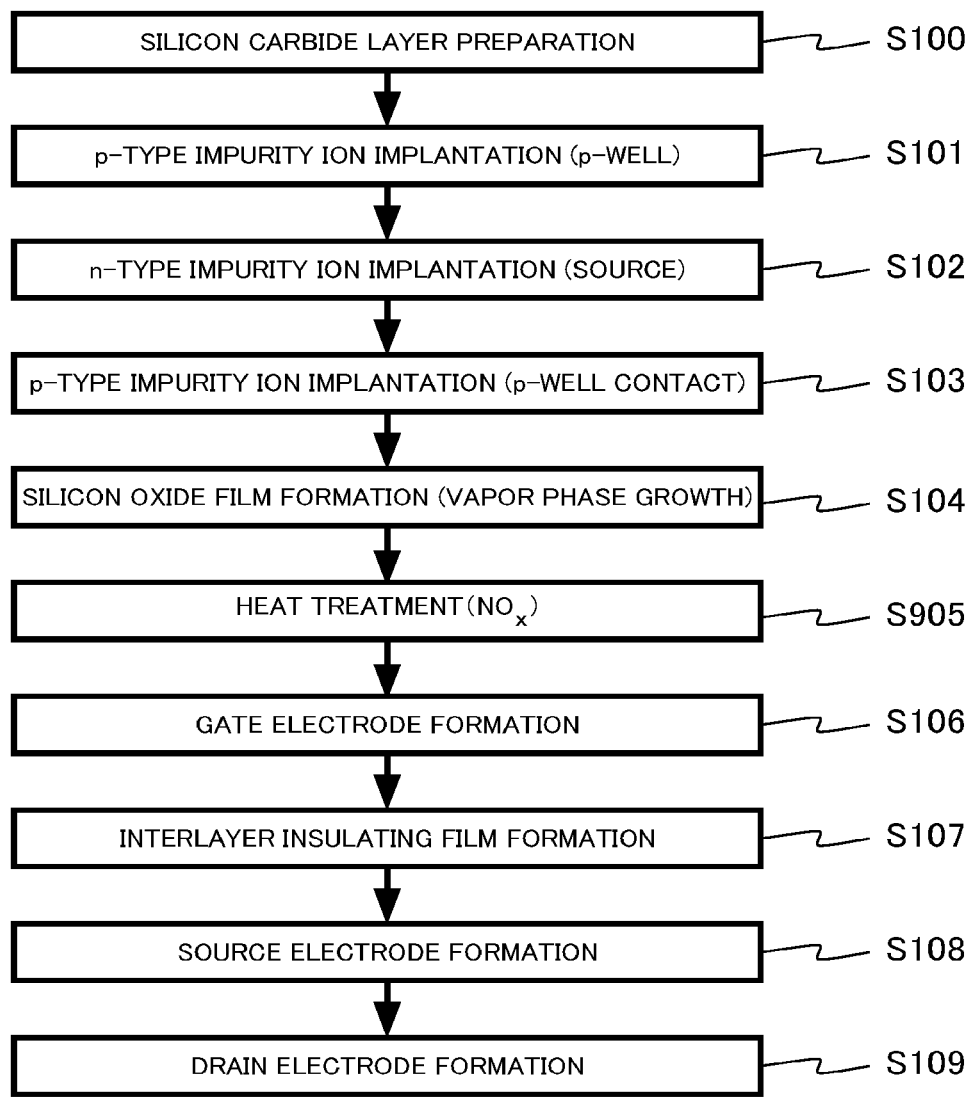
FIG. 6 is a process flow diagram of a method for manufacturing a semiconductor device according to a comparative example.

FIG. 6 is a process flow diagram of a method for manufacturing a semiconductor device according to a comparative example. In the method for manufacturing the semiconductor device according to the comparative example, heat treatment (step S905) is performed instead of the first heat treatment (step S105) in the method for manufacturing the semiconductor device according to the first embodiment.

In step S905, the heat treatment is performed. The heat treatment is performed in an atmosphere including nitrogen oxide gas (NOx). The nitrogen oxide gas is, for example, nitric monoxide gas (NO). Further, the nitrogen oxide gas is, for example, dinitrogen monoxide gas ($N_2O$).

A temperature of the heat treatment is, for example, equal to or more than 1050° C. and equal to or less than 1450° C.

The heat treatment in step S905 does not include carbon dioxide gas ($CO_2$) as heat treatment atmosphere gas. For example, the heat treatment is heat treatment at 1200° C. in $N_2$ diluted NO 50% atmosphere gas. Since the gas generated by substrate oxidation (CO gas or $CO_2$ gas) is discharged to an abatement system, the heat treatment does not include an effective amount (equal to or more than 10% in a partial pressure) of carbon dioxide as atmosphere gas during the heat treatment. If it is desired to introduce an effective amount of carbon dioxide, it is necessary to intentionally introduce carbon dioxide as the heat treatment atmosphere gas.

By the heat treatment in step S905, the interface termination region is formed at the interface between the silicon carbide layer and the silicon oxide film.

Figure 7:
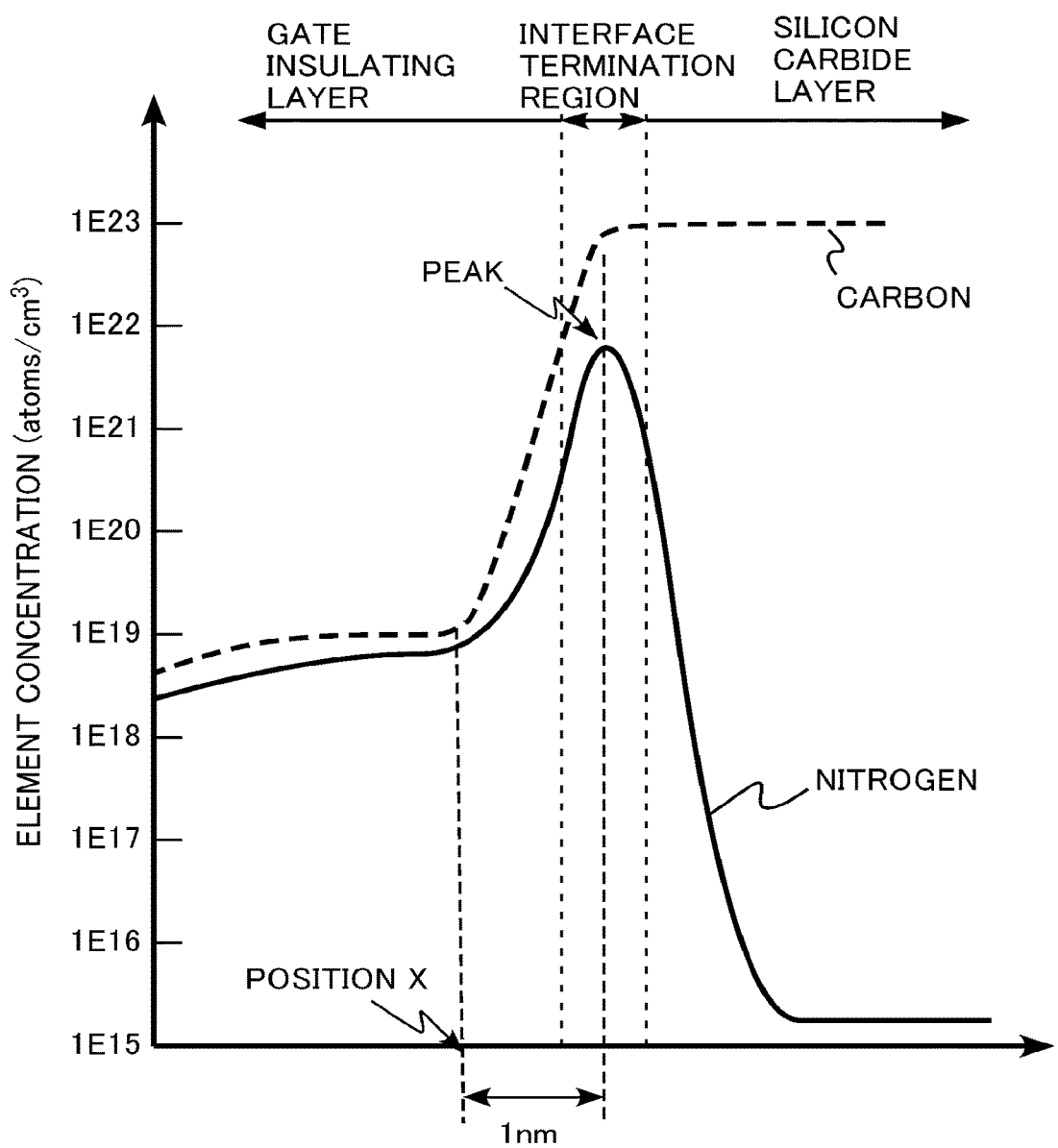
FIG. 7 is a diagram showing an element concentration distribution of the semiconductor device according to the comparative example.

FIG. 7 is a diagram showing an element concentration distribution of the semiconductor device according to the comparative example. The semiconductor device according to the comparative example is a MOSFET manufactured by the manufacturing method shown in FIG. 6.

FIG. 7 is a diagram showing element concentration distributions in the gate insulating layer, the interface termination region, and the silicon carbide layer. FIG. 7 shows concentration distributions of nitrogen and carbon.

The nitrogen concentration distribution has a peak in the interface termination region. A peak nitrogen concentration is, for example, equal to or more than $1\times10^{21}$ $cm^{-3}$ and less than $1\times10^{22}$ $cm^{33}$. Nitrogen is segregated at the interface between the silicon carbide layer and the gate insulating layer.

The nitrogen concentration at a position X to be 1 nm away from the peak of the nitrogen concentration distribution to the side of the gate insulating layer is higher than $1\times10^{18}$ $cm^{-3}$. As shown in FIG. 7, although the nitrogen concentration gradually decreases from the interface, a shoulder structure is formed and a large amount of nitrogen is distributed in the insulating film.

The carbon concentration distribution decreases from the interface termination region toward the gate insulating layer. The carbon concentration at the position X is higher than $1\times10^{18}$ $cm^{-3}$. It is considered that carbon is diffused into the gate insulating film, because the heat treatment in step S905 is accompanied by the substrate oxidation. As shown in FIG. 7, although the carbon concentration gradually decreases from the interface, a shoulder structure is formed and a large amount of carbon is distributed in the insulating film.

The MOSFET according to the comparative example includes the interface termination region in which nitrogen is segregated. Therefore, similarly to the MOSFET 100 according to the first embodiment, the decrease in the carrier mobility is suppressed.

The MOSFET according to the comparative example has a higher concentration of carbon or nitrogen in the gate insulating layer than that in the MOSFET 100 according to the first embodiment. Carbon in the gate insulating layer forms carbon defects. Further, nitrogen in the gate insulating layer forms, for example, a C—O—N bond.

It is considered that carbon in the gate insulating layer is derived from carbon released from the silicon carbide layer, when the face of the silicon carbide layer is oxidized by the nitrogen oxide gas. Further, it is considered that nitrogen in the nitrogen oxide gas is bonded to carbon released from the silicon carbide layer to form a C—O—N bond, so that nitrogen remains in the gate insulating layer.

Therefore, in the MOSFET according to the comparative example, the decrease in the carrier mobility, the change in the threshold voltage, the increase in the leakage current of the gate insulating layer, or the decrease in the reliability of the gate insulating layer due to the carbon defects in the gate insulating layer causes a problem.

In the MOSFET 100 according to the first embodiment, as shown in FIG. 3, the carbon concentration at the position X in the gate insulating layer 28 is equal to or less than $1\times10^{18}$ $cm^{-3}$. Further, the nitrogen concentration at the position X is equal to or less than $1\times10^{18}$ $cm^{-3}$.

In the MOSFET 100 according to the first embodiment, as shown in FIG. 3, the concentration of carbon or nitrogen in the gate insulating layer 28 is lower than that of the MOSFET according to the comparative example. Therefore, the amount of carbon defects in the gate insulating layer 28 is small. The amount of C—O—N bonds to be carbon defects including nitrogen in the gate insulating layer 28 is also small.

Therefore, in the MOSFET 100 according to the first embodiment, the decrease in the carrier mobility, the change in the threshold voltage, the increase in the leakage current of the gate insulating layer, or the decrease in the reliability of the gate insulating layer due to the carbon defects in the gate insulating layer is suppressed.

From the viewpoint of reducing the amount of carbon defects in the gate insulating layer 28, the concentration at the position X of the complex including the carbon atom bonded to the oxygen atom and the nitrogen atom bonded to the oxygen atom is preferably equal to or less than $1\times10^{10}$ $cm^{-3}$. In other words, the concentration at the position X of the C—O—N bond is preferably equal to or less than $1\times10^{18}$ $cm^{-3}$.

The MOSFET 100 according to the first embodiment is manufactured using the manufacturing method according to the first embodiment.

In the manufacturing method according to the first embodiment, after the silicon oxide film is formed in step S104, the first heat treatment is performed in step S105. The first heat treatment is performed in an atmosphere including carbon dioxide gas ($CO_2$) and nitrogen oxide gas (NOx).

By the nitrogen oxide gas, the interface termination region 40 in which the dangling bond on the face of the silicon carbide layer 10 is terminated by nitrogen is formed. At this time, the nitrogen atoms are introduced into the carbon sites of the crystal structure of silicon carbide, so that the dangling bond is terminated.

By the nitrogen oxide gas, the interface termination region 40 is formed while the face of the silicon carbide layer 10 is oxidized.

By the presence of the carbon dioxide gas in the atmosphere of the first heat treatment, a reaction of Formula (1) progresses on the face of the silicon carbide layer 10. That is, the presence of the carbon dioxide gas becomes a driving force that progresses the reaction of Formula (1) to the right.

$$C+CO_2 \rightarrow 2CO \quad (1)$$

By the presence of the carbon dioxide gas in the atmosphere, an effect of extracting the carbon atoms from the carbon sites of silicon carbide is produced. Therefore, the nitrogen atoms are easily introduced into the carbon sites of silicon carbide. In other words, the interface termination due to the nitrogen atoms is likely to progress.

Therefore, the first heat treatment can be performed at a lower temperature as compared with a case where the carbon dioxide gas is not present in the atmosphere. By lowering the temperature of the first heat treatment, oxidation of the face of the silicon carbide layer 10 due to the nitrogen oxide gas can be suppressed. By suppressing the oxidation of the face of the silicon carbide layer 10, the nitrogen concentration of the interface termination region 40 can be increased.

Therefore, as compared with the manufacturing method according to the comparative example, the nitrogen concentration of the interface termination region 40 can be increased in the manufacturing method according to the first embodiment. The nitrogen concentration at the peak of the nitrogen concentration distribution in the interface termination region 40 can be increased. By increasing the nitrogen concentration at the peak of the nitrogen concentration distribution in the interface termination region 40, the decrease in the carrier mobility is suppressed.

From the viewpoint of suppressing the decrease in the carrier mobility, the nitrogen concentration at the peak of the nitrogen concentration distribution in the interface termination region 40 of the nitrogen concentration distribution is preferably equal to or more than $1\times10^{22}$ cm$^{-3}$ and more preferably equal to or more than $5\times10^{22}$ cm$^{-3}$.

Further, the reaction of Formula (1) progresses, so that carbon released by the oxidation of the face of the silicon carbide layer 10 becomes CO and is removed into the atmosphere. Therefore, the amount of carbon remaining in the gate insulating layer 28 decreases. As a result, the carbon defects in the gate insulating layer 28 are reduced.

Further, the amount of carbon remaining in the gate insulating layer 28 decreases, so that the amount of C—O—N bonds formed in the gate insulating layer 28 also decreases. Therefore, the nitrogen concentration in the gate insulating layer 28 also decreases.

According to the manufacturing method according to the first embodiment, it is possible to realize the MOSFET 100 in which the amount of carbon defects in the gate insulating layer 28 is reduced.

From the viewpoint of progressing oxidation of the silicon carbide layer 10 and increasing the nitrogen concentration in the interface termination region 40, the temperature of the first heat treatment is preferably equal to or more than 1050° C. and more preferably equal to or more than 1100° C.

From the viewpoint of suppressing excessive oxidation of the silicon carbide layer 10 and increasing the nitrogen concentration in the interface termination region 40, the temperature of the first heat treatment is preferably equal to or less than 1450° C., more preferably equal to or less than 1350° C., further preferably equal to or less than 1250° C., and most preferably equal to or less than 1150° C.

From the viewpoint of effectively removing carbon released during oxidation of the face of the silicon carbide layer 10, the partial pressure of the carbon dioxide gas in the atmosphere of the first heat treatment is preferably equal to or more than 10%, more preferably equal to or more than 20%, and further preferably equal to or more than 30%.

From the viewpoint of progressing oxidation of the silicon carbide layer 10 and increasing the nitrogen concentration in the interface termination region 40, the partial pressure of the nitrogen oxide gas in the atmosphere of the first heat treatment is preferably equal to or more than 10%, more preferably equal to or more than 20%, and further preferably equal to or more than 30%.

The ratio of the partial pressure of the nitrogen oxide gas to the partial pressure of the carbon dioxide gas in the atmosphere of the first heat treatment is preferably equal to or more than 0.8 and equal to or less than 1.2. When carbon at the substrate interface is extracted with carbon dioxide, the presence of nitrogen in the vicinity facilitates the progress of nitrogen substitution of carbon. Therefore, the presence of carbon dioxide and nitrogen oxide in the same amount is effective for improving characteristics of the interface. Further, since carbon in the insulating film is extracted with carbon dioxide and treated with oxygen, the presence of carbon dioxide and oxidant in the same amount is effective for improving characteristics of the insulating film.

As described above, according to the first embodiment, the semiconductor device and the method for manufacturing the semiconductor device that reduce the amount of carbon defects in the insulating layer are realized.

Second Embodiment

A method for manufacturing a semiconductor device according to a second embodiment is different from the method for manufacturing the semiconductor device according to the first embodiment in that a silicon oxide film is formed by thermal oxidation in an atmosphere including oxygen gas or water vapor and carbon dioxide gas. Hereinafter, description of contents overlapping with those of the first embodiment will be partially omitted.

Hereinafter, a case where oxidizing gas is oxygen gas will be described as an example.

Figure 8:
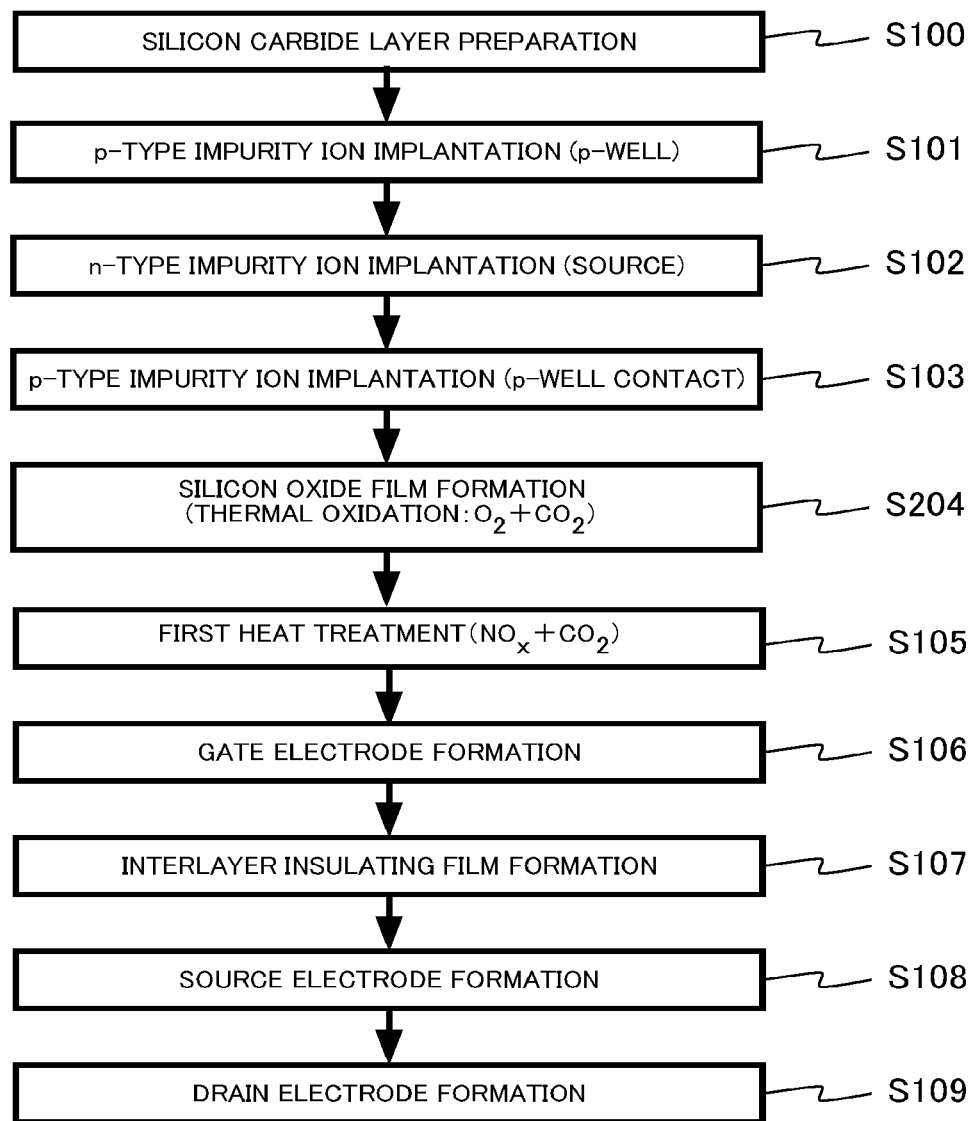
FIG. 8 is a process flow diagram of a method for manufacturing a semiconductor device according to a second embodiment.

FIG. 8 is a process flow diagram of the method for manufacturing the semiconductor device according to the second embodiment. In the method for manufacturing the semiconductor device according to the second embodiment, instead of forming the silicon oxide film by vapor phase growth (step S104) in the method for manufacturing the semiconductor device according to the first embodiment, the silicon oxide film is formed by the thermal oxidation in an atmosphere including oxygen gas and carbon dioxide gas (step S204).

In step S204, the silicon oxide film is formed by the thermal oxidation in an atmosphere including oxygen gas ($O_2$) and carbon dioxide gas ($CO_2$).

For example, the thermal oxidation is performed by supplying the oxygen gas ($O_2$) and the carbon dioxide gas ($CO_2$) to a reaction furnace containing a silicon carbide layer 10.

A temperature of the thermal oxidation is, for example, equal to or more than 1050° C. and equal to or less than 1450° C.

When the silicon carbide layer 10 is thermally oxidized, the carbon dioxide gas is present in the atmosphere, so that a reaction of Formula (1) progresses on a face of the silicon carbide layer 10. That is, the presence of the carbon dioxide gas becomes a driving force that progresses the reaction of Formula (1) to the right.

$$C+CO_2 \rightarrow 2CO \qquad (1)$$

The reaction of Formula (1) progresses, so that carbon released by the oxidation of the face of the silicon carbide layer 10 becomes CO and is removed into the atmosphere. Therefore, an amount of carbon remaining in a gate insulating layer 28 is smaller than that in a case where the carbon dioxide gas is not included in the atmosphere. As a result, the carbon defects in the gate insulating layer 28 are reduced.

Further, the amount of carbon remaining in the gate insulating layer 28 decreases, so that the amount of C—O—N bonds formed in the gate insulating layer 28 also decreases. Therefore, the nitrogen concentration in the gate insulating layer 28 also decreases.

Even when the oxidizing gas is water vapor, the same functions and effect as those in the oxygen gas are obtained.

As described above, according to the second embodiment, the semiconductor device and the method for manufacturing the semiconductor device that reduce the amount of carbon defects in the insulating layer are realized.

Third Embodiment

A method for manufacturing a semiconductor device according to a third embodiment is different from the method for manufacturing the semiconductor device according to the first embodiment in that a silicon oxide film is formed by thermal oxidation in an atmosphere including nitrogen oxide gas and carbon dioxide gas, and first heat treatment is not included. Hereinafter, description of contents overlapping with those of the first embodiment will be partially omitted.

Figure 9:
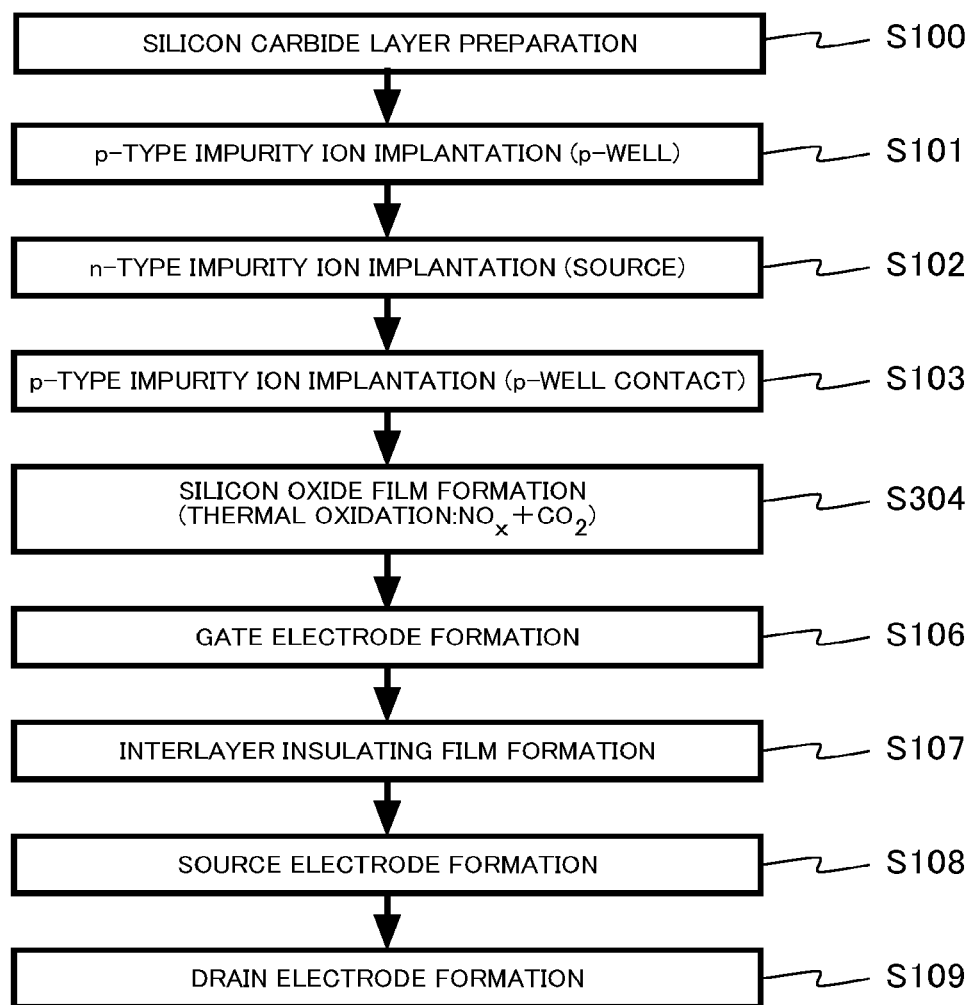
FIG. 9 is a process flow diagram of a method for manufacturing a semiconductor device according to a third embodiment.

FIG. 9 is a process flow diagram of the method for manufacturing the semiconductor device according to the third embodiment. In the method for manufacturing the semiconductor device according to the third embodiment, instead of forming the silicon oxide film by vapor phase growth (step S104) in the method for manufacturing the semiconductor device according to the first embodiment, the silicon oxide film is formed by the thermal oxidation in an atmosphere including nitrogen oxide gas and carbon dioxide gas (step S304). Further, the method for manufacturing the semiconductor device according to the third embodiment does not include first heat treatment (step S105) in the method for manufacturing the semiconductor device according to the first embodiment.

In step S304, the silicon oxide film is formed by the thermal oxidation in an atmosphere including nitrogen oxide gas (NOx) and carbon dioxide gas ($CO_2$). By the thermal oxidation including the nitrogen oxide gas (NOx), an interface termination region 40 is formed at an interface between a silicon carbide layer 10 and the silicon oxide film.

The nitrogen oxide gas is, for example, nitric monoxide gas (NO). Further, the nitrogen oxide gas is, for example, dinitrogen monoxide gas ($N_2O$).

For example, the thermal oxidation is performed by supplying the nitrogen oxide gas (NOx) and the carbon dioxide gas ($CO_2$) to a reaction furnace containing the silicon carbide layer 10.

A temperature of the thermal oxidation is, for example, equal to or more than 1050° C. and equal to or less than 1450° C.

A partial pressure of the carbon dioxide gas in the atmosphere of the thermal oxidation is, for example, equal to or more than 10% and equal to or less than 50%.

A partial pressure of the nitrogen oxide gas in the atmosphere of the thermal oxidation is, for example, equal to or more than 10% and equal to or less than 50%.

A ratio of the partial pressure of the nitrogen oxide gas to the partial pressure of the carbon dioxide gas in the atmosphere of the thermal oxidation is, for example, equal to or more than 0.8 and equal to or less than 1.2.

When the silicon carbide layer 10 is thermally oxidized, the carbon dioxide gas is present in the atmosphere, so that a reaction of Formula (1) progresses on a face of the silicon carbide layer 10. That is, the presence of the carbon dioxide gas becomes a driving force that progresses the reaction of Formula (1) to the right.

$$C+CO_2 \rightarrow 2CO \qquad (1)$$

The reaction of Formula (1) progresses, so that carbon released by the oxidation of the face of the silicon carbide layer 10 becomes CO and is removed into the atmosphere. Therefore, an amount of carbon remaining in a gate insulating layer 28 is smaller than that in a case where the carbon dioxide gas is not included in the atmosphere. Therefore, an amount of carbon defects in the gate insulating layer 28 is reduced.

Further, the amount of carbon remaining in the gate insulating layer 28 decreases, so that the amount of C—O—N bonds formed in the gate insulating layer 28 also decreases. Therefore, the nitrogen concentration in the gate insulating layer 28 also decreases.

Further, according to the manufacturing method according to the third embodiment, it is possible to simultaneously form the silicon oxide film and the interface termination region 40. Therefore, a MOSFET is easily manufactured.

As described above, according to the third embodiment, the semiconductor device and the method for manufacturing the semiconductor device that reduce the amount of carbon defects in the insulating layer are realized.

Fourth Embodiment

A method for manufacturing a semiconductor device according to a fourth embodiment is different from the method for manufacturing the semiconductor device according to the first embodiment in that, before first heat treatment, second heat treatment is further performed at a temperature equal to or more than 1050° C. and equal to or less than 1450° C., in an atmosphere including nitrogen oxide gas, and the first heat treatment is performed in an atmosphere including oxygen gas or water vapor and carbon dioxide gas. Hereinafter, description of contents overlapping with those of the first embodiment will be partially omitted.

Hereinafter, a case where oxidizing gas of the first heat treatment is oxygen gas will be described as an example.

Figure 10:
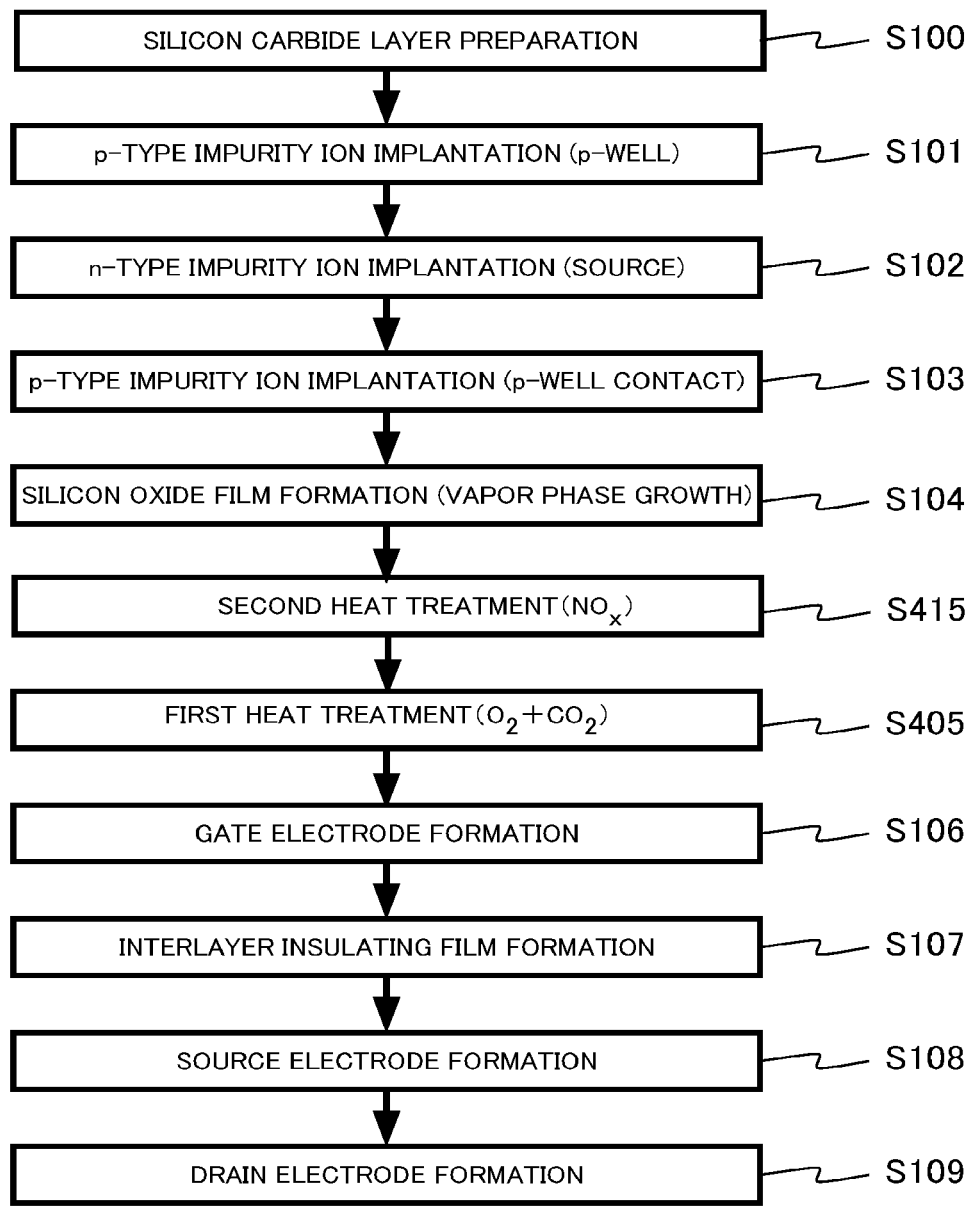
FIG. 10 is a process flow diagram of a method for manufacturing a semiconductor device according to a fourth embodiment.

FIG. 10 is a process flow diagram of the method for manufacturing the semiconductor device according to the fourth embodiment. In the method for manufacturing the semiconductor device according to the fourth embodiment, instead of the first heat treatment (step S105) performed in an atmosphere including nitrogen oxide gas and carbon dioxide gas in the method for manufacturing the semiconductor device according to the first embodiment, first heat treatment (step S405) is performed in the atmosphere including the oxygen gas and the carbon dioxide gas. Further, second heat treatment (step S415) is performed before the first heat treatment (step S405).

The method for manufacturing the semiconductor device according to the fourth embodiment is the same as a case of adding the first heat treatment (step S405) after heat treatment (step S905) in the method for manufacturing the semiconductor device according to the comparative example shown in FIG. 6.

In step S104, a silicon oxide film is formed on a silicon carbide layer. The silicon oxide film finally becomes the gate insulating layer 28. The silicon oxide film is formed by vapor phase growth.

In step S415, the second heat treatment is performed. The second heat treatment is performed in an atmosphere including nitrogen oxide gas (NOx). The nitrogen oxide gas is, for example, nitric monoxide gas (NO). Further, the nitrogen oxide gas is, for example, dinitrogen monoxide gas ($N_2O$).

A temperature of the heat treatment is, for example, equal to or more than 1050° C. and equal to or less than 1450° C.

By the second heat treatment in step S415, an interface termination region 40 including nitrogen is formed at an interface between the silicon carbide layer 10 and the silicon oxide film.

In step S405, the first heat treatment is performed. The first heat treatment is performed in an atmosphere including oxygen gas ($O_2$) and carbon dioxide gas ($CO_2$).

A temperature of the first heat treatment is lower than a temperature of the second heat treatment. The temperature of the first heat treatment is, for example, equal to or more than 750° C. and less than 1050° C.

A partial pressure of the carbon dioxide gas in the atmosphere of the first heat treatment is, for example, equal to or more than 10% and equal to or less than 50%.

A partial pressure of the oxygen gas in the atmosphere of the first heat treatment is, for example, equal to or more than 10% and equal to or less than 50%.

A ratio of the partial pressure of the oxygen gas to the partial pressure of the carbon dioxide gas in the atmosphere of the first heat treatment is, for example, equal to or more than 0.8 and equal to or less than 1.2.

By the first heat treatment, carbon defects in the silicon oxide film are reduced.

Hereinafter, functions and effects of the method for manufacturing the semiconductor device according to the fourth embodiment will be described.

An element concentration distribution immediately after the interface termination region 40 is formed at the interface between the silicon carbide layer 10 and the silicon oxide film by the second heat treatment in step S415 is the same as that of the semiconductor device according to the comparative example shown in FIG. 7.

Immediately after the second heat treatment in step S415, a concentration of carbon or nitrogen in the silicon oxide film is high. Carbon in the silicon oxide film forms carbon defects. Further, nitrogen in the silicon oxide film forms, for example, a C—O—N bond.

In the method for manufacturing the semiconductor device according to the fourth embodiment, after the second heat treatment, the first heat treatment is performed in the atmosphere including the oxygen gas ($O_2$) and the carbon dioxide gas ($CO_2$). By the presence of the carbon dioxide gas in the atmosphere of the first heat treatment, a reaction of Formula (1) progresses in the silicon oxide film. That is, the presence of the carbon dioxide gas becomes a driving force that progresses the reaction of Formula (1) to the right.

$$C + CO_2 \rightarrow 2CO \quad (1)$$

By the presence of the carbon dioxide gas in the atmosphere, an effect of extracting carbon atoms introduced into oxygen sites of silicon oxide as carbon monoxide gas is produced. Therefore, the carbon defects in the silicon oxide film are reduced. In particular, the amount of carbon defects formed by the introduction of the carbon atoms into the oxygen sites of silicon oxide is reduced.

If oxidizing gas such as the oxygen gas is not included in the atmosphere of the first heat treatment, portions where the carbon atoms of the oxygen sites of silicon oxide are removed become oxygen vacancies (Oxide Vacancy: Vo). The oxygen vacancies in the silicon oxide film form trap levels. Therefore, when an amount of oxygen vacancies (Vo) increases, this is not preferable because characteristics of a MOSFET are degraded.

In the method for manufacturing the semiconductor device according to the fourth embodiment, the oxidizing gas such as the oxygen gas is included in the atmosphere of the first heat treatment. Therefore, the oxygen vacancies are filled with oxygen atoms, and the oxygen vacancies formed by the reaction of Formula (1) disappear. Therefore, degradation of the characteristics of the MOSFET is suppressed.

Further, the carbon dioxide gas ($CO_2$) is present in the atmosphere of the first heat treatment, so that a reaction of Formula (2) is suppressed. That is, a large amount of carbon dioxide on the right side makes it difficult for the reaction of Formula (2) to progress to the right. Note that $Vo:SiO_2$ means $SiO_2$ having the oxygen vacancies (Vo).

$$SiO_2 + CO \rightarrow Vo:SiO_2 + CO_2 \quad (2)$$

That is, the carbon dioxide gas is present in the atmosphere of the first heat treatment to suppress the formation of the oxygen vacancies (Vo) in the oxide film due to carbon monoxide (CO) discharged by Formula (1). Therefore, degradation of the characteristics of the MOSFET due to the formation of the oxygen vacancies (Vo) is suppressed.

From the viewpoint of reducing the amount of carbon defects in the silicon oxide film, the temperature of the first heat treatment is preferably equal to or more than 750° C., more preferably equal to or more than 850° C., and further preferably equal to or more than 925° C.

Further, from the viewpoint of suppressing oxidation of the silicon carbide layer 10, the temperature of the first heat treatment is preferably less than 1050° C., more preferably equal to or less than 1000° C., and further preferably equal to or less than 950° C.

Even when the oxidizing gas is water vapor, the same functions and effect as those in the oxygen gas are obtained.

As described above, according to the fourth embodiment, the semiconductor device and the method for manufacturing the semiconductor device that reduce the amount of carbon defects in the insulating layer are realized.

Fifth Embodiment

A method for manufacturing a semiconductor device according to a fifth embodiment is different from the method for manufacturing the semiconductor device according to the fourth embodiment in that first heat treatment is performed in an atmosphere including nitrogen oxide gas and carbon dioxide gas. Hereinafter, description of contents overlapping with those of the fourth embodiment will be partially omitted.

Figure 11:
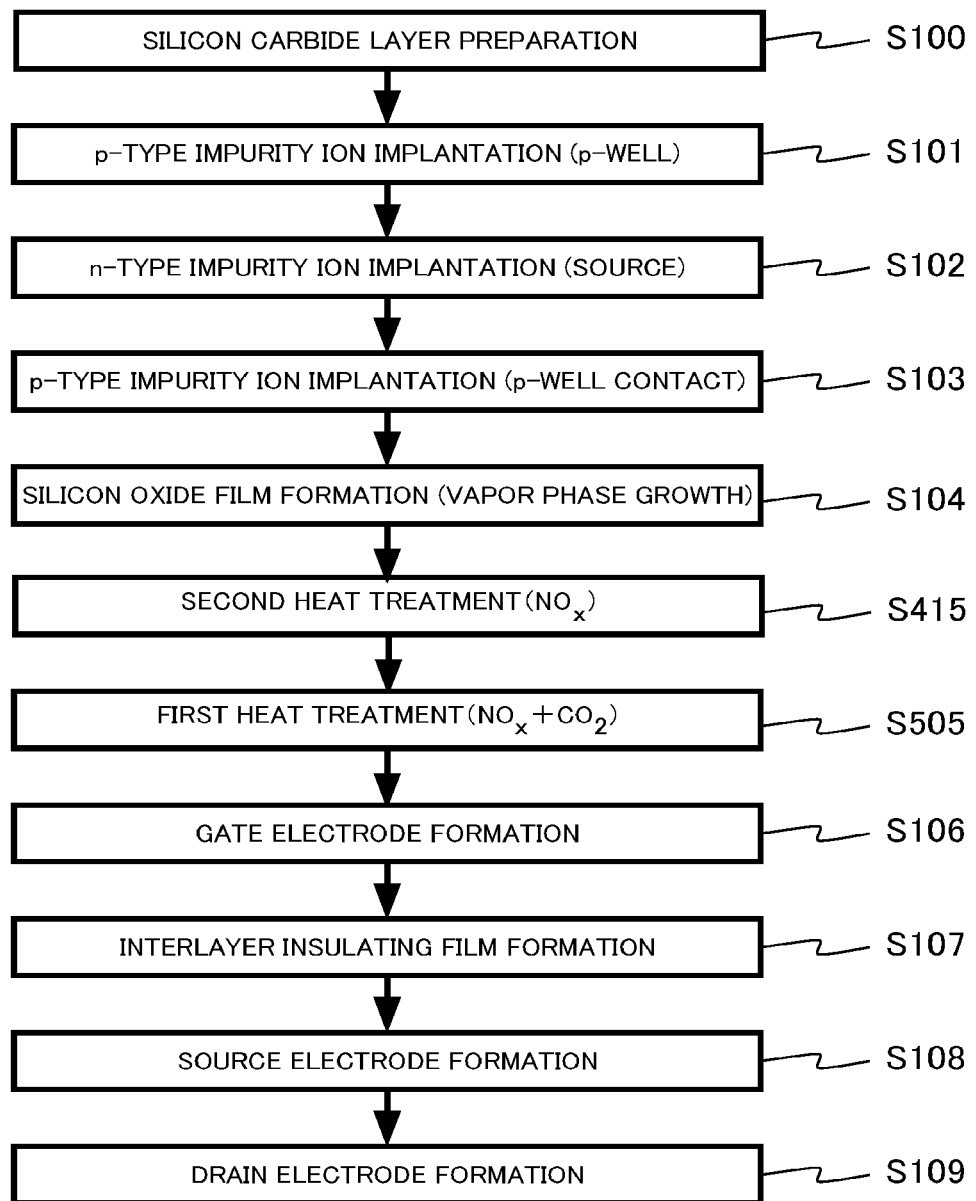
FIG. 11 is a process flow diagram of a method for manufacturing a semiconductor device according to a fifth embodiment.

FIG. 11 is a process flow diagram of the method for manufacturing the semiconductor device according to the fifth embodiment. The method for manufacturing the semiconductor device according to the fifth embodiment includes first heat treatment (step S505) performed in the atmosphere including the nitrogen oxide gas and the carbon dioxide gas, instead of the first heat treatment (step S405) performed in an atmosphere including oxygen gas and carbon dioxide gas in the method for manufacturing the semiconductor device according to the fourth embodiment.

The method for manufacturing the semiconductor device according to the fifth embodiment is the same as a case of adding the first heat treatment (step S505) after heat treatment (step S905) in the method for manufacturing the semiconductor device according to the comparative example shown in FIG. 6.

In step S104, a silicon oxide film is formed on a silicon carbide layer. The silicon oxide film finally becomes the gate insulating layer 28. The silicon oxide film is formed by vapor phase growth.

In step S415, the second heat treatment is performed. The second heat treatment is performed in an atmosphere including nitrogen oxide gas (NOx). The nitrogen oxide gas is, for example, nitric monoxide gas (NO). Further, the nitrogen oxide gas is, for example, dinitrogen monoxide gas ($N_2O$).

A temperature of the heat treatment is, for example, equal to or more than 1050° C. and equal to or less than 1450° C.

By the second heat treatment in step S415, an interface termination region 40 including nitrogen is formed at an interface between the silicon carbide layer 10 and the silicon oxide film.

In step S505, the first heat treatment is performed. The first heat treatment is performed in an atmosphere including nitrogen oxide gas (NOx) and carbon dioxide gas ($CO_2$). The nitrogen oxide gas is an example of oxidizing gas. The nitrogen oxide gas is, for example, nitric monoxide gas (NO). Further, the nitrogen oxide gas is, for example, dinitrogen monoxide gas ($N_2O$).

A temperature of the first heat treatment is lower than a temperature of the second heat treatment. The temperature of the first heat treatment is, for example, equal to or more than 750° C. and less than 1050° C.

A partial pressure of the carbon dioxide gas in the atmosphere of the first heat treatment is, for example, equal to or more than 10% and equal to or less than 50%.

A partial pressure of the nitrogen oxide gas in the atmosphere of the first heat treatment is, for example, equal to or more than 10% and equal to or less than 50%.

A ratio of the partial pressure of the nitrogen oxide gas to the partial pressure of the carbon dioxide gas in the atmosphere of the first heat treatment is, for example, equal to or more than 0.8 and equal to or less than 1.2.

By the first heat treatment, carbon defects in the silicon oxide film are reduced.

Hereinafter, functions and effects of the method for manufacturing the semiconductor device according to the fifth embodiment will be described.

An element concentration distribution immediately after the interface termination region 40 is formed at the interface between the silicon carbide layer 10 and the silicon oxide film by the second heat treatment in step S415 is the same as that of the semiconductor device according to the comparative example shown in FIG. 7.

Immediately after the second heat treatment in step S415, a concentration of carbon or nitrogen in the silicon oxide film is high. Carbon in the silicon oxide film forms carbon defects. Further, nitrogen in the silicon oxide film forms, for example, a C—O—N bond.

In the method for manufacturing the semiconductor device according to the fifth embodiment, after the second heat treatment, the first heat treatment is performed in the atmosphere including the nitrogen oxide gas (NOx) and the carbon dioxide gas ($CO_2$). By the presence of the carbon dioxide gas in the atmosphere of the first heat treatment, a reaction of Formula (1) progresses in the silicon oxide film. That is, the presence of the carbon dioxide gas becomes a driving force that progresses the reaction of Formula (1) to the right.

$$C+CO_2 \rightarrow 2CO \qquad (1)$$

By the presence of the carbon dioxide gas in the atmosphere, an effect of extracting carbon atoms introduced into oxygen sites of silicon oxide as carbon monoxide gas is produced. Therefore, the carbon defects in the silicon oxide film are reduced. In particular, the amount of carbon defects formed by the introduction of the carbon atoms into the oxygen sites of silicon oxide is reduced.

If oxidizing gas such as the nitrogen oxide gas (NOx) is not included in the atmosphere of the first heat treatment, portions where the carbon atoms of the oxygen sites of silicon oxide are removed become oxygen vacancies (Oxide Vacancy: Vo). The oxygen vacancies in the silicon oxide film form trap levels. Therefore, when an amount of oxygen vacancies (Vo) increases, this is not preferable because characteristics of a MOSFET are degraded.

In the method for manufacturing the semiconductor device according to the fifth embodiment, oxidizing gas such as the nitrogen oxide gas (NOx) is included in the atmosphere of the first heat treatment. Therefore, the oxygen vacancies are filled with oxygen atoms, and the oxygen vacancies formed by the reaction of Formula (1) disappear. Therefore, degradation of the characteristics of the MOSFET is suppressed.

Further, the carbon dioxide gas ($CO_2$) is present in the atmosphere of the first heat treatment, so that a reaction of Formula (2) is suppressed. That is, a large amount of carbon dioxide on the right side makes it difficult for the reaction of Formula (2) to progress to the right. Note that Vo:$SiO_2$ means $SiO_2$ having the oxygen vacancies (Vo).

$$SiO_2+CO \rightarrow Vo:SiO_2+CO_2 \qquad (2)$$

That is, the carbon dioxide gas is present in the atmosphere of the first heat treatment to suppress the formation of the oxygen vacancies (Vo) in the oxide film due to carbon monoxide (CO) discharged by Formula (1). Therefore, degradation of the characteristics of the MOSFET due to the formation of the oxygen vacancies (Vo) is suppressed.

Further, the nitrogen oxide gas (NOx) is present in the atmosphere of the first heat treatment, so that an amount of C—O—N bonds in the silicon oxide film is also reduced. It is considered that this is because nitrogen included in the nitrogen oxide gas reacts with nitrogen having a C—O—N bond, diffuses as nitrogen gas, and disappears from the silicon oxide film.

According to the method for manufacturing the semiconductor device according to the fifth embodiment, in addition to the carbon defects formed by the introduction of the carbon atoms into the oxygen sites of silicon oxide, the amount of C—O—N bonds formed by the introduction of the carbon atoms and the nitrogen atoms into the silicon sites of silicon oxide can be reduced.

From the viewpoint of reducing the amount of carbon defects in the silicon oxide film, the temperature of the first heat treatment is preferably equal to or more than 750° C., more preferably equal to or more than 850° C., and further preferably equal to or more than 925° C.

Further, from the viewpoint of suppressing oxidation of the silicon carbide layer 10, the temperature of the first heat treatment is preferably less than 1050° C., more preferably equal to or less than 1000° C., and further preferably equal to or less than 950° C.

As described above, according to the fifth embodiment, the semiconductor device and the method for manufacturing the semiconductor device that reduce the amount of carbon defects in the insulating layer are realized.

Sixth Embodiment

A method for manufacturing a semiconductor device according to a sixth embodiment is different from the method for manufacturing the semiconductor device according to the first embodiment in that first heat treatment is performed in an atmosphere including oxygen gas or water vapor and carbon dioxide gas. Hereinafter, description of contents overlapping with those of the first embodiment will be partially omitted.

Hereinafter, a case where oxidizing gas is oxygen gas will be described as an example.

Figure 12:
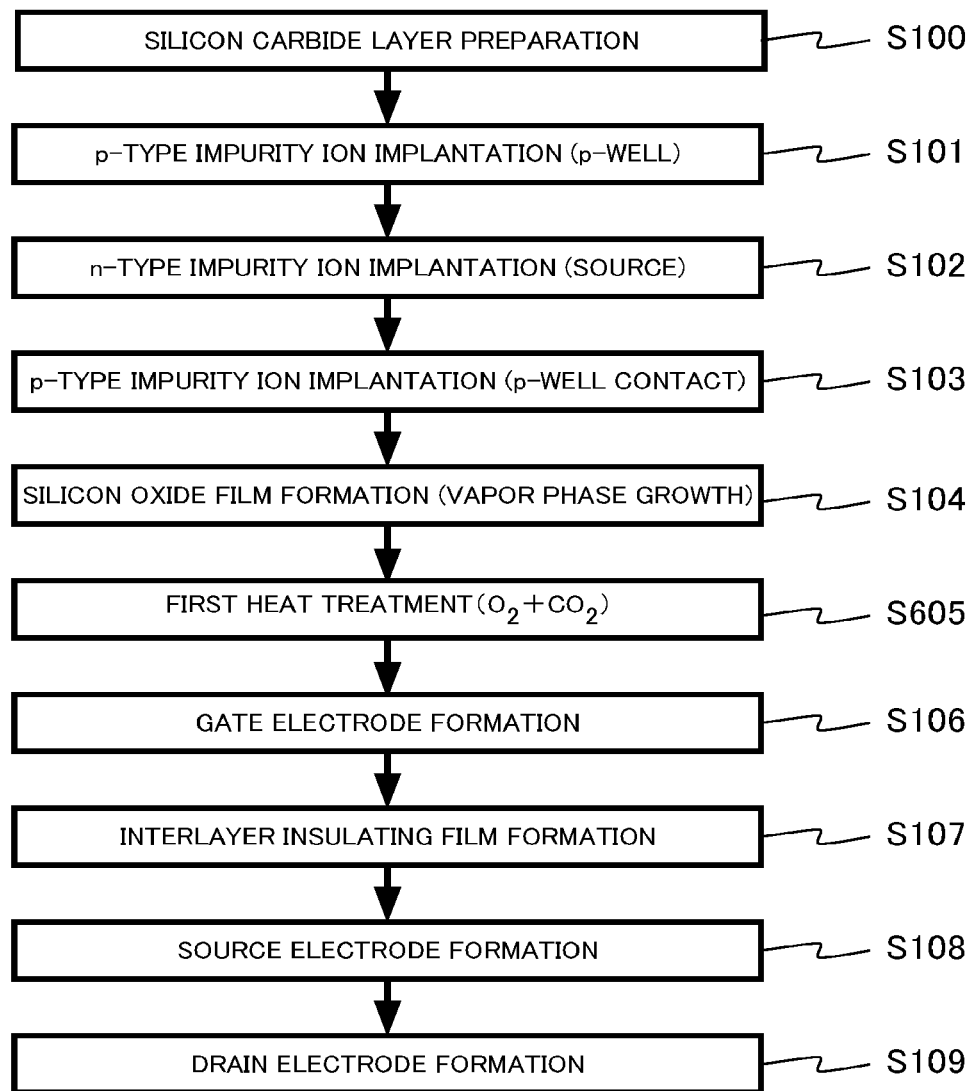
FIG. 12 is a process flow diagram of a method for manufacturing a semiconductor device according to a sixth embodiment.

FIG. 12 is a process flow diagram of the method for manufacturing the semiconductor device according to the sixth embodiment. The method for manufacturing the semiconductor device according to the sixth embodiment performs first heat treatment (step S605) in an atmosphere including oxygen gas ($O_2$) and carbon dioxide gas ($CO_2$), instead of performing first heat treatment (step S105) in an atmosphere including nitrogen oxide gas (NOx) and carbon dioxide gas ($CO_2$) in the method for manufacturing the semiconductor device according to the first embodiment.

In step S605, the first heat treatment is performed. The first heat treatment is performed in an atmosphere including oxygen gas ($O_2$) and carbon dioxide gas ($CO_2$).

A temperature of the first heat treatment is, for example, equal to or more than 1050° C. and equal to or less than 1450° C.

A partial pressure of the carbon dioxide gas in the atmosphere of the first heat treatment is, for example, equal to or more than 10% and equal to or less than 50%.

A partial pressure of the oxygen gas in the atmosphere of the first heat treatment is, for example, equal to or more than 10% and equal to or less than 50%.

A ratio of the partial pressure of the oxygen gas to the partial pressure of the carbon dioxide gas in the atmosphere of the first heat treatment is, for example, equal to or more than 0.8 and equal to or less than 1.2.

By the first heat treatment, a silicon oxide film with reduced carbon defects is formed.

The first heat treatment also functions as densification annealing of the silicon oxide film. By the first heat treatment, the silicon oxide film becomes a high-density film.

In the manufacturing method according to the sixth embodiment, after the silicon oxide film is formed in step S104, the first heat treatment is performed in step S605. The first heat treatment is performed in an atmosphere including oxygen gas ($O_2$) and carbon dioxide gas ($CO_2$).

By the oxygen gas, oxidation of a face of the silicon carbide layer 10 is progressed.

By the presence of the carbon dioxide gas in the atmosphere of the first heat treatment, a reaction of Formula (1) progresses on the face of the silicon carbide layer 10. That is, the presence of the carbon dioxide gas becomes a driving force that progresses the reaction of Formula (1) to the right.

$$C + CO \rightarrow 2CO \quad (1)$$

The reaction of Formula (1) progresses, so that carbon released by the oxidation of the face of the silicon carbide layer 10 becomes CO and is removed into the atmosphere. Therefore, the amount of carbon remaining in the gate insulating layer 28 decreases. As a result, the carbon defects in the gate insulating layer 28 are reduced. As compared with a conventional thermal oxide film, the interface is formed by a thermal oxide film having better characteristics.

By reducing the amount of carbon remaining in the gate insulating layer 28, when interface nitriding treatment such as the heat treatment (NOx) of FIG. 6 or the first heat treatment (NOx+$CO_2$) of FIG. 8 is added, an amount of C—O—N bonds formed in the gate insulating layer 28 is also reduced. Therefore, the nitrogen concentration in the gate insulating layer 28 also decreases.

Even when the oxidizing gas is water vapor, the same functions and effect as those in the oxygen gas are obtained.

As described above, according to the manufacturing method according to the sixth embodiment, it is possible to realize the MOSFET in which the amount of carbon defects in the gate insulating layer 28 is reduced.

Seventh Embodiment

A semiconductor device according to a seventh embodiment is different from the semiconductor device according to the first embodiment in that the semiconductor device is a trench gate type MOSFET including a gate electrode in a trench. Hereinafter, description of contents overlapping with those of the first embodiment will be partially omitted.

Figure 13:
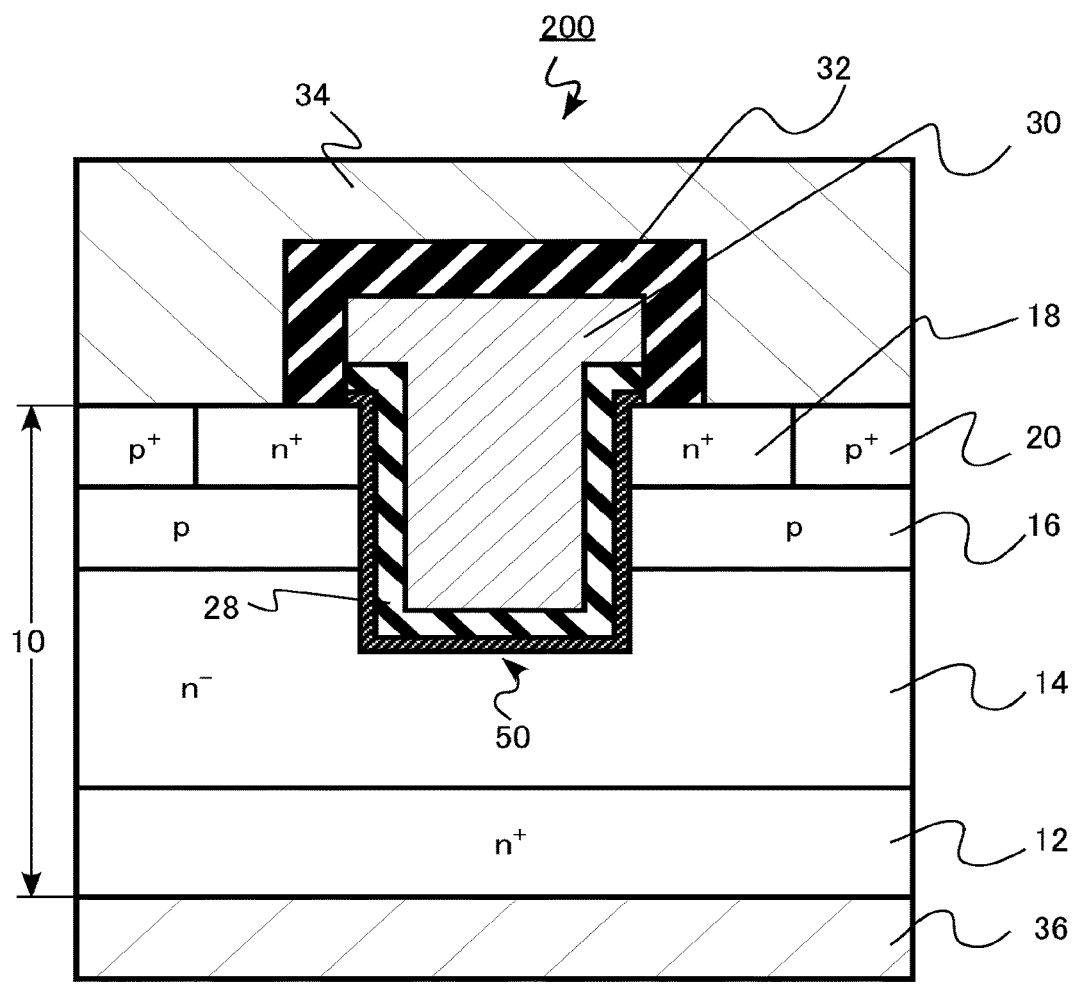
FIG. 13 is a schematic cross-sectional view of a semiconductor device according to a seventh embodiment.

FIG. 13 is a schematic cross-sectional view of the semiconductor device according to the seventh embodiment. The semiconductor device according to the seventh embodiment is a MOSFET 200. The MOSFET 200 is a trench gate type MOSFET including a gate electrode in a trench. Further, the MOSFET 200 is an n-channel MOSFET using electrons as carriers.

The MOSFET 200 includes a silicon carbide layer 10, a gate insulating layer 28 (silicon oxide layer), a gate electrode 30, an interlayer insulating film 32, a source electrode 34, a drain electrode 36, an interface termination region 40 (region), and a trench 50.

The silicon carbide layer 10 includes a drain region 12, a drift region 14, a p-well region 16, a source region 18, and a p-well contact region 20.

The trench 50 penetrates the source region 18 and the p-well region 16 and reaches the drift region 14. A bottom face of the trench 50 is disposed in the drift region 14.

In the trench 50, the gate insulating layer 28 and the gate electrode 30 are provided. Side faces of the trench 50 are, for example, faces having off angles equal to or more than 0 degrees and equal to or less than 8 degrees with respect to an m face.

As described above, according to the seventh embodiment, a semiconductor device in which an amount of carbon defects in the gate insulating layer 28 is reduced can be realized. Further, since the trench gate type is used, a channel density per unit area of a chip is increased, and on-resistance of the MOSFET is reduced.

Eighth Embodiment

A semiconductor device according to an eighth embodiment is different from the semiconductor device according to the first embodiment in that a gate insulating layer is present in a termination region of a MOSFET. Hereinafter, description of contents overlapping with those of the first embodiment will be partially omitted.

Figure 14:
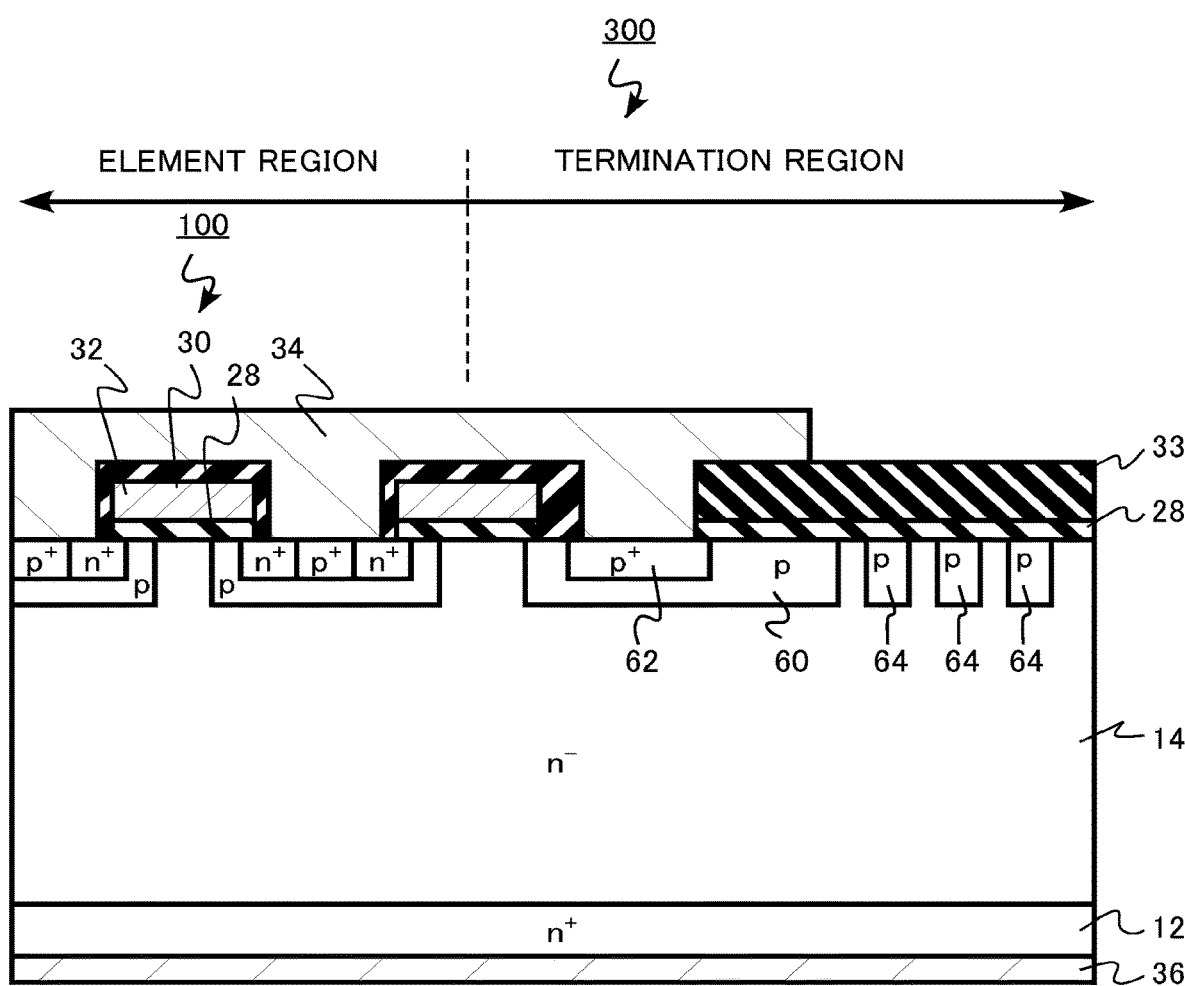
FIG. 14 is a schematic cross-sectional view of a semiconductor device according to an eighth embodiment.

FIG. 14 is a schematic cross-sectional view of the semiconductor device according to the eighth embodiment. The semiconductor device according to the eighth embodiment is a MOSFET 300. The MOSFET 300 includes an element region and a termination region provided around the element region. The termination region has a function of improving a breakdown voltage of the MOSFET 300.

In the element region, for example, the MOSFET 100 according to the first embodiment is disposed as a unit cell.

The termination region includes a p-type RESURF region 60, a $p^+$-type contact region 62, p-type guard ring regions 64, a gate insulating layer 28 (silicon oxide layer), and a field oxide film 33.

A configuration of the gate insulating layer 28 is the same as that of the MOSFET 100 according to the first embodiment.

The field oxide film 33 is, for example, a silicon oxide film.

An interface termination region including nitrogen (not shown) is provided between a silicon carbide layer 10 and the gate insulating layer 28.

When the MOSFET 300 is turned off, a depletion layer is formed in the RESURF region 60, the guard ring regions 64, and a drift region 14 between the guard ring regions 64, so that a breakdown voltage of the MOSFET 300 is improved.

However, when there is a trap level due to carbon defects in the gate insulating layer 28, the charges are trapped in an energy level. By an electric field of the trapped charges, a desired depletion layer may not be formed. In this case, the breakdown voltage of the MOSFET 300 is degraded.

According to the eighth embodiment, the amount of carbon defects in the gate insulating layer 28 is reduced. Therefore, the trap level in the gate insulating layer 28 is reduced. As a result, a desired depletion layer is formed and a MOSFET having a stable breakdown voltage is realized.

Ninth Embodiment

An inverter circuit and a drive device according to a ninth embodiment are an inverter circuit and a drive device including the semiconductor device according to the first embodiment.

Figure 15:
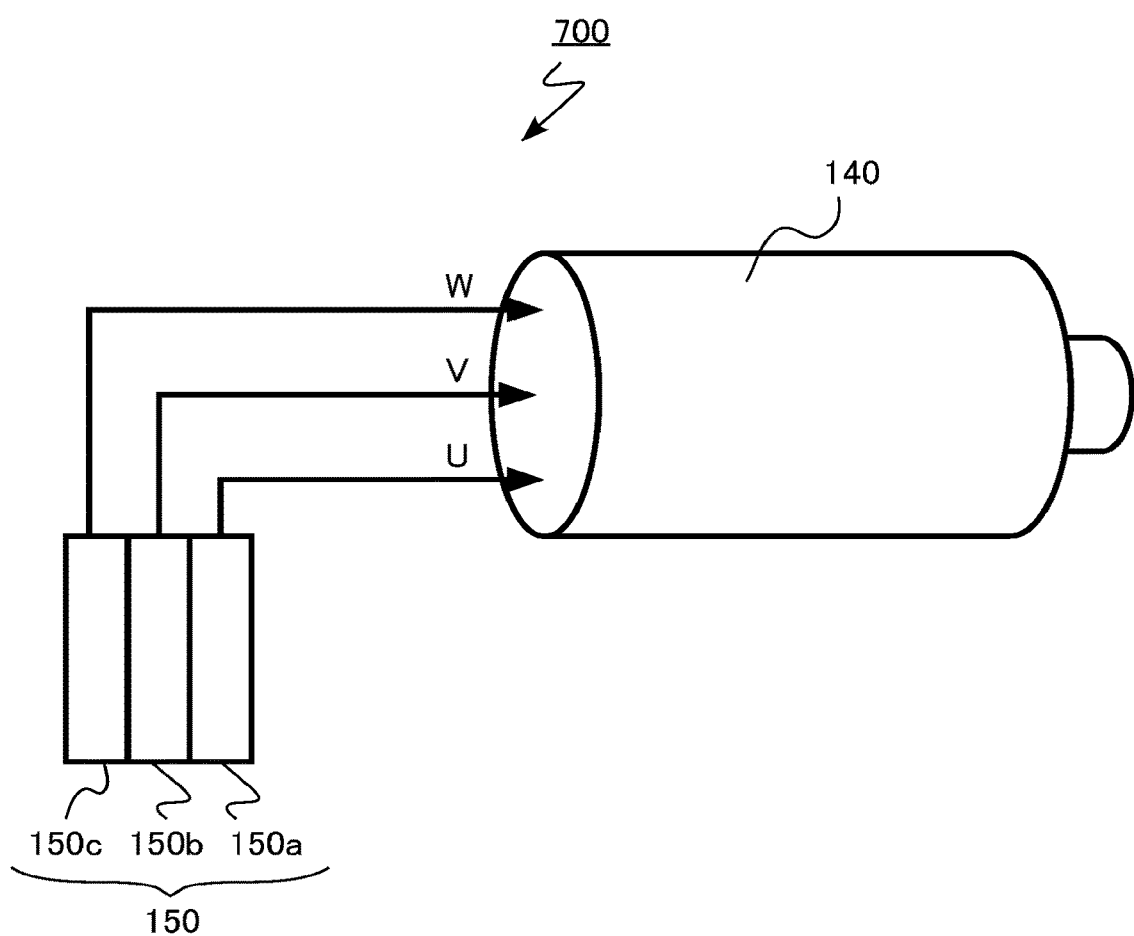
FIG. 15 is a schematic diagram of a drive device according to a ninth embodiment.

FIG. 15 is a schematic diagram of the drive device according to the ninth embodiment. A drive device 700 includes a motor 140 and an inverter circuit 150.

The inverter circuit 150 includes three semiconductor modules 150a, 150b, and 150c using the MOSFET 100 according to the first embodiment as a switching element. By connecting the three semiconductor modules 150a, 150b, and 150c in parallel, the three-phase inverter circuit 150 including three AC voltage output terminals U, V, and W is realized. The motor 140 is driven by an AC voltage output from the inverter circuit 150.

According to the ninth embodiment, characteristics of the inverter circuit 150 and the drive device 700 are improved by including the MOSFET 100 having improved characteristics.

Tenth Embodiment

A vehicle according to a tenth embodiment is a vehicle including the semiconductor device according to the first embodiment.

Figure 16:
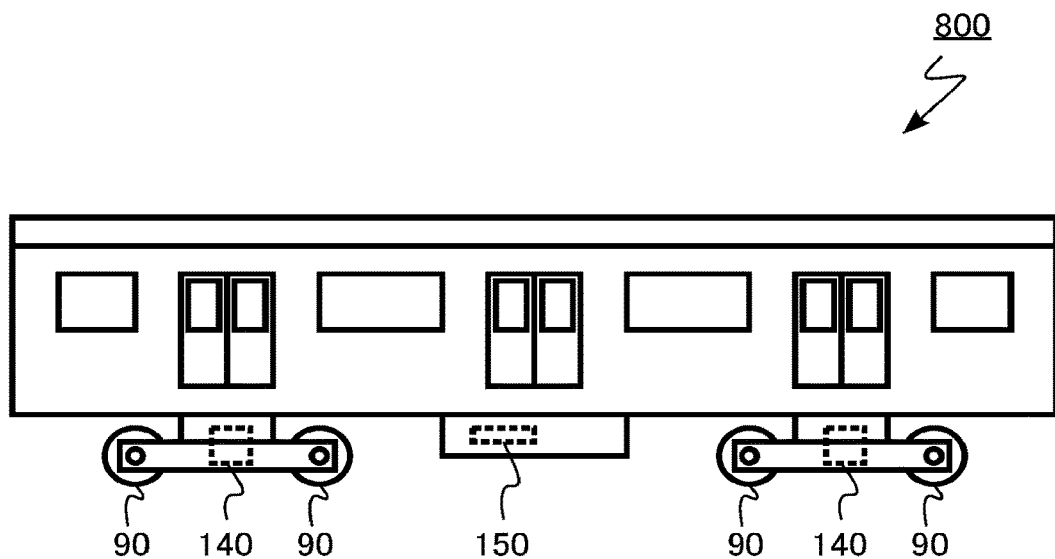
FIG. 16 is a schematic diagram of a vehicle according to a tenth embodiment.

FIG. 16 is a schematic diagram of the vehicle according to the tenth embodiment. A vehicle 800 according to the tenth embodiment is a railroad vehicle. The vehicle 800 includes motors 140 and an inverter circuit 150.

The inverter circuit 150 includes three semiconductor modules using the MOSFET 100 according to the first embodiment as a switching element. By connecting the three semiconductor modules in parallel, the three-phase inverter circuit 150 including three AC voltage output terminals U, V, and W is realized. The motor 140 is driven by an AC voltage output from the inverter circuit 150. Wheels 90 of the vehicle 800 are rotated by the motor 140.

According to the tenth embodiment, characteristics of the vehicle 800 are improved by including the MOSFET 100 having improved characteristics.

Eleventh Embodiment

A vehicle according to an eleventh embodiment is a vehicle including the semiconductor device according to the first embodiment.

Figure 17:
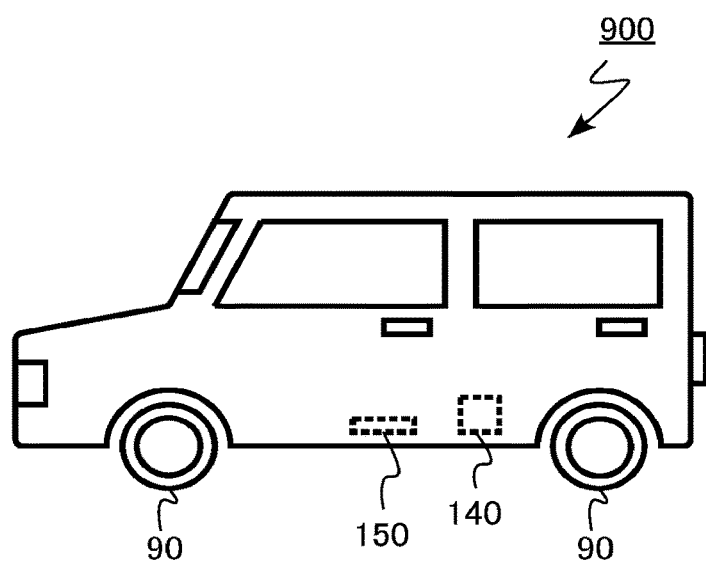
FIG. 17 is a schematic diagram of a vehicle according to an eleventh embodiment.

FIG. 17 is a schematic diagram of the vehicle according to the eleventh embodiment. A vehicle 900 according to the eleventh embodiment is an automobile. The vehicle 900 includes a motor 140 and an inverter circuit 150.

The inverter circuit 150 includes three semiconductor modules using the MOSFET 100 according to the first embodiment as a switching element. By connecting the three semiconductor modules in parallel, the three-phase inverter circuit 150 including three AC voltage output terminals U, V, and W is realized.

The motor 140 is driven by an AC voltage output from the inverter circuit 150. Wheels 90 of the vehicle 900 are rotated by the motor 140.

According to the eleventh embodiment, characteristics of the vehicle 900 are improved by including the MOSFET 100 having improved characteristics.

Twelfth Embodiment

An elevator according to a twelfth embodiment is an elevator including the semiconductor device according to the first embodiment.

Figure 18:
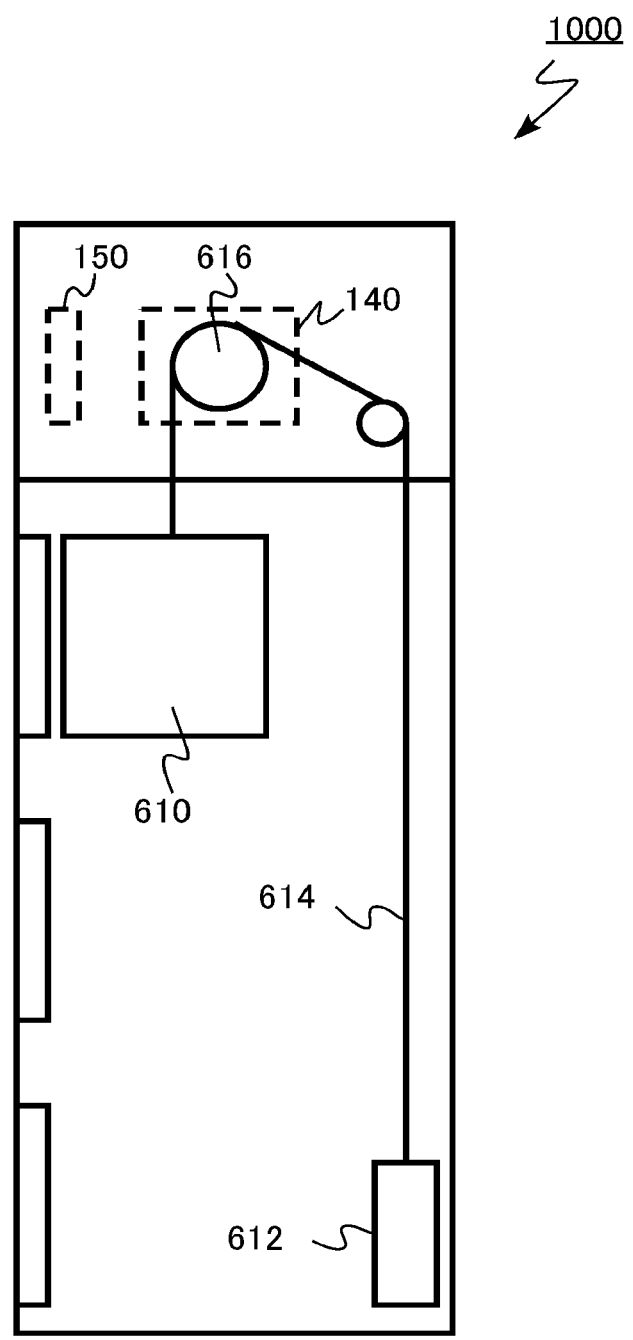
FIG. 18 is a schematic diagram of an elevator according to a twelfth embodiment.

FIG. 18 is a schematic diagram of the elevator according to the twelfth embodiment. An elevator 1000 according to the twelfth embodiment includes a car 610, a counter weight 612, a wire rope 614, a winding machine 616, a motor 140, and an inverter circuit 150.

The inverter circuit 150 includes three semiconductor modules using the MOSFET 100 according to the first embodiment as a switching element. By connecting the three semiconductor modules in parallel, the three-phase inverter circuit 150 including three AC voltage output terminals U, V, and W is realized.

The motor 140 is driven by an AC voltage output from the inverter circuit 150. The winding machine 616 is rotated by the motor 140 and the car 610 is elevated.

According to the twelfth embodiment, characteristics of the elevator 1000 are improved by including the MOSFET 100 having improved characteristics.

As described above, in the first to eighth embodiments, the case where 4H-SiC is used as the crystal structure of silicon carbide has been described as an example. However, the present disclosure can be applied to silicon carbide of other crystal structure such as 6H-SiC and 3C-SiC.

Further, in the first to eighth embodiments, the case where the gate insulating layer 28 is provided on the silicon face or the m face of the silicon carbide layer has been described as an example. However, the present disclosure can be applied to a case where the gate insulating layer 28 is provided on other face of the silicon carbide layer, for example, a carbon face, an a face, a (0-33-8) face, or the like.

An oxidation rate of the silicon carbide layer depends on the plane orientation. In the first to eighth embodiments, it is preferable to optimize the temperature of the first heat treatment or the second heat treatment according to the plane orientation.

Further, the present disclosure can be applied to an n-channel insulated gate bipolar transistor (IGBT).

Further, the present disclosure can be applied to a p-channel MOSFET or IGBT, in addition to the n-channel MOSFET or IGBT.

Further, in the ninth to twelfth embodiments, the case where the semiconductor device according to the present disclosure is applied to the vehicle or the elevator has been described as an example. However, the semiconductor device according to the present disclosure can be applied to a power conditioner of a photovoltaic power generation system and the like, for example.

Further, in the ninth to twelfth embodiments, the case where the semiconductor device according to the first embodiment is applied has been described as an example. However, the semiconductor device according to any one of the second to eighth embodiments can be applied.

While certain embodiments have been described, these embodiments have been presented by way of example only, and are not intended to limit the scope of the inventions. Indeed, the semiconductor device, the method for manufacturing the semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    forming a silicon oxide film on a silicon carbide layer; and
    performing first heat treatment in an atmosphere including carbon dioxide gas and at least one oxidizing gas selected from the group consisting of nitrogen oxide gas, oxygen gas, and water vapor,
    wherein the silicon oxide film is formed by vapor phase growth.

2. The method according to claim 1, wherein the first heat treatment is performed at a temperature equal to or more than 1050° C. and equal to or les than 1450° C., in an atmosphere including nitrogen oxide gas and carbon dioxide gas.

3. The method according to claim 1, wherein the first heat treatment is performed at a temperature equal to or more than 1050° C. and equal to or les than 1450° C., in an atmosphere including oxygen gas or water vapor and carbon dioxide gas.

4. The method according to claim 1, further comprising:
    performing second heat treatment before the performing the first heat treatment at a temperature equal to or more than 1050° C. and equal to or less than 1450° C., in an atmosphere including nitrogen oxide gas;
    wherein the first heat treatment is performed at a temperature equal to or more than 750° C. and less than 1050° C.

5. The method according to claim 4, wherein the first heat treatment is performed in an atmosphere including nitrogen oxide gas and carbon dioxide gas.

6. The method according to claim 1, wherein a partial pressure of the carbon dioxide gas in the atmosphere of the first heat treatment is equal to or more than 10%.

7. The method according to claim 1, wherein a partial pressure of the oxidizing gas in the atmosphere of the first heat treatment is equal to or more than 10%.

8. The method according to claim 1, further comprising: forming a gate electrode on the silicon oxide film.

9. A method for manufacturing a semiconductor device, comprising a:
    forming a silicon oxide film on a silicon carbide layer; and
    performing first heat treatment in an atmosphere including carbon dioxide gas and at least one oxidizing gas selected from the group consisting of nitrogen oxide gas, oxygen gas, and water vapor,
    wherein
        the silicon oxide film is formed by thermal oxidation in an atmosphere including oxygen gas and carbon dioxide go, and
        the first heat treatment is performed at a temperature equal to or more than 1050° C. and equal to or less than 140° C., in an atmosphere including nitrogen oxide gas and carbon dioxide gas.

10. A method for manufacturing a semiconductor device comprising:
    forming a silicon oxide film on a silicon carbide layer; and
    performing first heat treatment in an atmosphere including carbon dioxide gas and at least one oxidizing gas selected from the group consisting of nitrogen oxide gas, oxygen gas, and water vapor,
    wherein a thickness of the silicon oxide film is equal to or more than 30 nm and equal to or less than 100 nm.

11. A method for manufacturing a semiconductor device, comprising:
    forming a silicon oxide film on a silicon carbide layer by thermal oxidation, in an atmosphere including carbon dioxide gas and at least one oxidizing gas selected from the group consisting of nitrogen oxide gas, oxygen gas, and water vapor,
    wherein the thermal oxidation is performed a temperature equal to or more the 1050° C. and equal to or less than 1450° C., in an atmosphere including nitrogen oxide gas and carbon dioxide gas.

12. A method for manufacturing a semiconductor device, comprising:
    forming a silicon oxide film on a silicon carbide layer by thermal oxidation, in an atmosphere including carbon dioxide gas and at least one oxidizing gas selected from the group consisting of nitrogen oxide gas, oxygen gas, and water vapor,
    wherein a partial pressure of the carbon dioxide gas in the atmosphere is equal to or more than 10%.

13. The method according to claim 12, wherein a thickness of the silicon oxide film is equal to or more than 30 nm and equal to or less then 100 nm.

14. The method according to claim 12, further comprising: forming a gate electrode on the silicon oxide film.

15. A method for manufacturing a semiconductor device, comprising:
    forming a silicon oxide film on a silicon carbide layer by thermal oxidation, in an atmosphere including carbon dioxide gas and at least one oxidizing gas selected from the group consisting of nitrogen oxide gas, oxygen gas, and water vapor, wherein a partial pressure of the oxidizing gas in the atmosphere is equal to or more than 10%.

\* \* \* \* \*